(12) United States Patent
Yang et al.

(10) Patent No.: US 10,297,617 B2
(45) Date of Patent: May 21, 2019

(54) DISPLAY DEVICE AND MANUFACTURING METHOD THEREOF

(71) Applicant: SAMSUNG DISPLAY CO., LTD., Yongin-si, Gyeonggi-Do (KR)

(72) Inventors: Yong Ho Yang, Yongin-si (KR); Hui Won Yang, Yongin-si (KR); Nak Cho Choi, Yongin-si (KR); Hwang Sup Shin, Yongin-si (KR); Jun Hee Lee, Yongin-si (KR)

(73) Assignee: SAMUNG DISPLAY CO., LTD., Yongin-Si, Gyeonggi-Do (KR)

( * ) Notice: Subject to any disclaimer, the term of this patent is extended or adjusted under 35 U.S.C. 154(b) by 104 days.

(21) Appl. No.: 15/491,448

(22) Filed: Apr. 19, 2017

(65) Prior Publication Data

US 2018/0097016 A1    Apr. 5, 2018

(30) Foreign Application Priority Data

Sep. 30, 2016    (KR) ........................ 10-2016-0126808

(51) Int. Cl.
*H01L 27/12* (2006.01)
(52) U.S. Cl.
CPC ........ *H01L 27/124* (2013.01); *H01L 27/1222* (2013.01); *H01L 27/1255* (2013.01); *H01L 27/1259* (2013.01)

(58) Field of Classification Search
CPC ......................... H01L 27/124–27/1244; H01L 27/1222–27/1233
See application file for complete search history.

(56) References Cited

U.S. PATENT DOCUMENTS

2015/0102355 A1*   4/2015   Yang .................... H01L 27/124
                                                                    257/72

FOREIGN PATENT DOCUMENTS

KR           10-1626362          5/2016

* cited by examiner

*Primary Examiner* — Amar Movva
(74) *Attorney, Agent, or Firm* — F. Chau & Associates, LLC

(57) ABSTRACT

A display device includes a scan line extending primarily in a first direction, disposed on a substrate, and transmitting a scan signal, a data line extending primarily in a second direction intersecting the first direction and transmitting a data signal, a driving voltage line extending primarily in the second direction and transmitting a driving voltage, a plurality of transistors including first and second transistors, wherein the second transistor is connected to the scan line and the data line, and the first transistor is connected to the second transistor, a light emitting element connected to the plurality of transistors, and a storage capacitor disposed between the substrate and an active pattern of the first transistor, the storage capacitor including a first electrode disposed on the substrate and a second electrode at least partially overlapping the first electrode. A first insulating layer is disposed between the first and second electrodes.

17 Claims, 22 Drawing Sheets

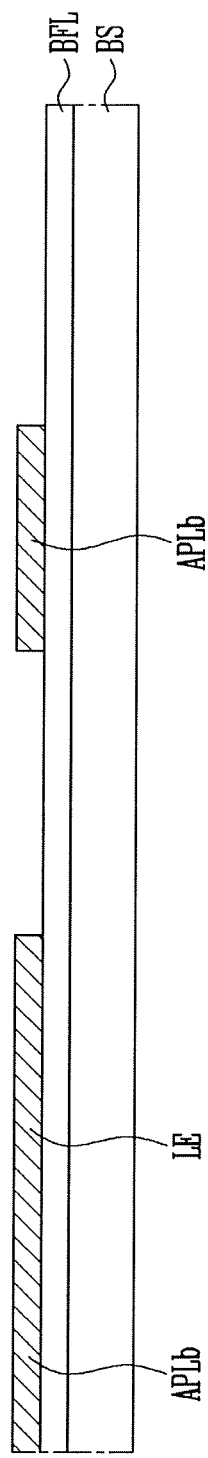

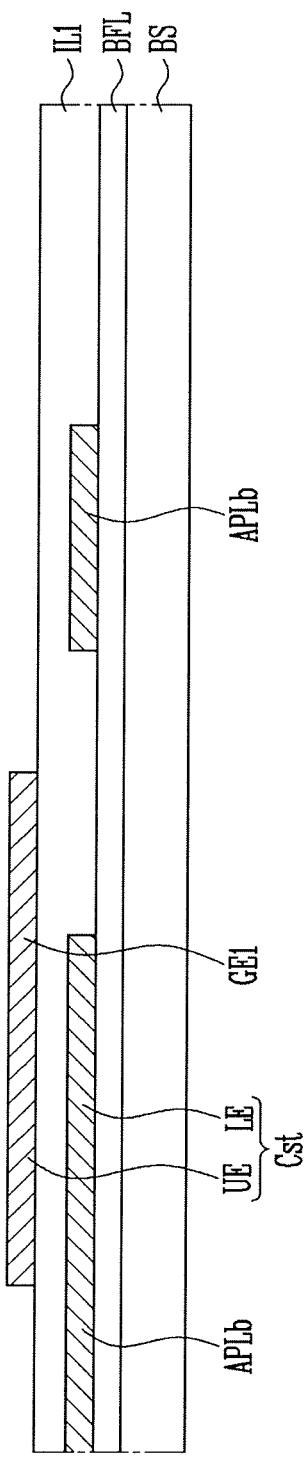

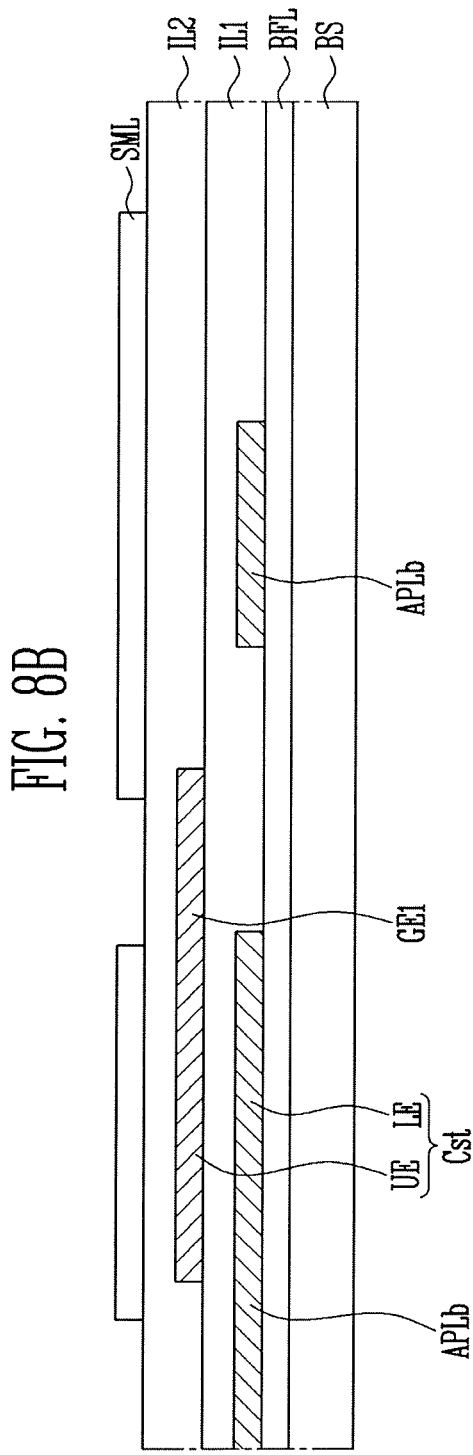

EL

ADL

S2

S1

DISPLAY DEVICE AND MANUFACTURING METHOD THEREOF

CROSS REFERENCE TO RELATED APPLICATION

The present application claims priority under 35 U.S.C. § 119 to Korean Patent Application No. 10-2016-0126808, filed on Sep. 30, 2016, in the Korean Intellectual Property Office, the disclosure of which is incorporated by reference herein in its entirety.

TECHNICAL FIELD

The present invention relates to a display device, and more particularly, to a display device and a manufacturing method thereof.

DISCUSSION OF THE RELATED ART

As an interest in displays panels and a demand for portable devices that include display panel increases, research is being conducted on display devices.

In recent times, as a demand for high resolution display panels is increasing, the size of a pixel is decreasing. In addition, the complexity of the structure of a circuit included in a pixel is increasing.

SUMMARY

According to an exemplary embodiment of the present invention, a display device includes a scan line extending primarily in a first direction and disposed on a substrate, the scan line transmitting a scan signal, a data line extending primarily in a second direction intersecting the first direction, the data line transmitting a data signal, a driving voltage line extending primarily in the second direction, the driving voltage line transmitting a driving voltage, a plurality of transistors including a first transistor and a second transistor, wherein the second transistor is connected to the scan line and the data line, and the first transistor is connected to the second transistor, a light emitting element connected to the plurality of transistors, and a storage capacitor disposed between the substrate and an active pattern of the first transistor, the storage capacitor including a first electrode disposed on the substrate and a second electrode at least partially overlapping the first electrode. A first insulating layer is disposed between the first and second electrodes.

According to an exemplary embodiment of the present invention, a method of manufacturing a display device includes forming an auxiliary power source line and a lower electrode of a storage capacitor on a substrate, forming a first insulating layer on the auxiliary power source line and the lower electrode, forming an upper electrode at least partially overlapping the lower electrode on the first insulating layer, forming a second insulating layer on the upper electrode, forming an active pattern on the second insulating layer, forming a third insulating layer on the active pattern, forming a gate pattern on the third insulating layer, forming a fourth insulating layer on the gate pattern, forming a data pattern on the fourth insulating layer, forming a passivation layer over the data pattern, and forming a light emitting element on the passivation layer, the light emitting element being electrically connected to a portion of the data pattern.

BRIEF DESCRIPTION OF THE DRAWINGS

The above and other features of the present invention will become more apparent by describing in detail exemplary embodiments thereof in conjunction with the accompanying drawings, in which:

FIGS. 6B, 7B, 8B, 9B, 10B and 11B are sectional views sequentially illustrating a manufacturing method of the pixel of FIG. 5, according to an exemplary embodiment of the present invention;

DETAILED DESCRIPTION OF THE EMBODIMENTS

Figure 1:
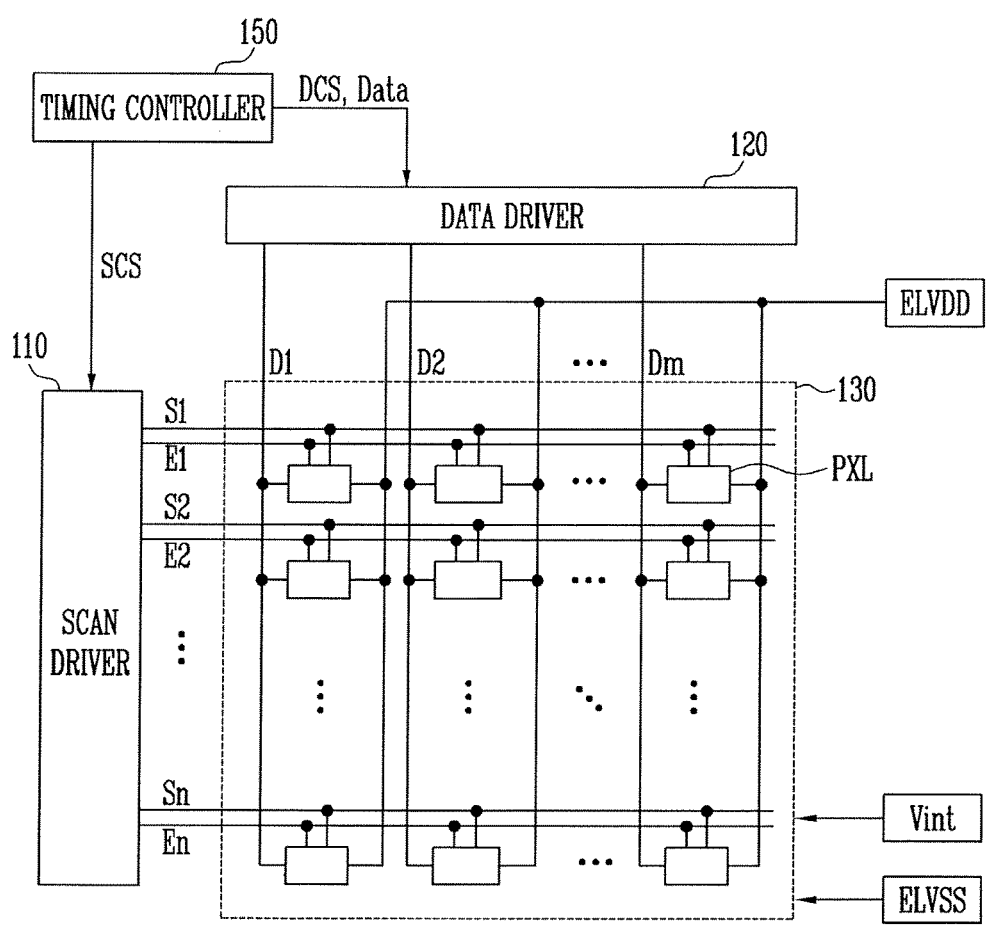
FIG. 1 is a diagram illustrating a display device according to an exemplary embodiment of the present invention.

Exemplary embodiments of the present invention will be described more fully hereinafter with reference to accompanying drawings. The present invention may, however, be embodied in different forms and should not be construed as limited to the embodiments set forth herein. Like reference numerals may refer to like elements throughout the specification. Duplicate descriptions of elements may be omitted for brevity. The sizes or proportions of elements illustrated in the drawings may be exaggerated for clarity.

It will be understood that when an element is referred to as being "on" another element, it can be directly on the other element, or intervening elements may also be present therebetween.

FIG. 1 is a diagram illustrating a display device according to an exemplary embodiment of the present invention.

Referring to FIG. 1, a display device may include a scan driver 110, a data driver 120, a pixel unit 130 including pixels PXL, and a timing controller 150.

The pixel unit 130 includes pixels PXL located in regions defined by scan lines S1 to Sn and data lines D1 to Dm. In FIG. 1, it is illustrated that the pixel unit 130 includes m×n pixels PXL (m and n are positive integers). The pixels PXL are supplied with a first power source ELVDD and a second power source ELVSS from a circuit. In an exemplary embodiment of the present invention, the second power source ELVSS may be set to have a lower voltage than the first power source ELVDD. The pixels PXL are supplied with a data signal while being selected in units of horizontal lines. The units of horizontal lines may correspond to the scan lines S1 to Sn and may be selected by a scan signal supplied to the scan lines S1 to Sn. Each of the pixels PXL, supplied with the data signal, generates light with a predetermined luminance while controlling the amount of current flowing in the second power source ELVSS from the first power source ELVDD via a light emitting element OLED. The current flowing through the light emitting element OLED may depend on the data signal. Each of the pixels PXL in the pixel unit 130 shown in FIG. 1 may be a sub-pixel included in a unit pixel. For example, each of the pixels PXL may be a sub-pixel that generates light of red, green, blue, or white colors, but the present invention is not limited thereto.

The timing controller 150 generates a data driving control signal DCS and a scan driving control signal SCS based on synchronization signals supplied from another circuit. The data driving control signal DCS, generated from the timing controller 150, is supplied to the data driver 120. The scan driving control signal SCS, generated from the timing controller 150, is supplied to the scan driver 110. Also, the timing controller 150 realigns data supplied from another circuit and supplies the realigned data Data to the data driver 120.

The scan driving control signal SCS may include start pulses and clock signals. The start pulses control first timings of a scan signal and a light emitting control signal. The clock signals are used to shift the start pulses.

The data driving control signal DCS may include a source start pulse and clock signals. The source start pulse controls a sampling start point of data. The clock signals are used to control a sampling operation.

The scan driver 110 is supplied with the scan driving control signal SCS from the timing controller 150. The scan driver 110, supplied with the scan driving control signal SCS, supplies scan signals to the scan lines S1 to Sn. For example, the scan driver 110 may sequentially supply scan signals to the scan lines S1 to Sn. When the scan signals are sequentially supplied to the scan lines S1 to Sn, the pixels PXL are selected in units of horizontal lines.

In addition, the scan driver 110, supplied with the scan driving control signal SCS, supplies light emitting control signals to light emitting control lines E1 to En. For example, the scan driver 110 may sequentially supply the light emitting control signals to the light emitting control lines E1 to En. The light emitting control signals are used to control light emitting times of the pixels PXL. For example, the light emitting control signal may be set to have a wider width than the scan signal. For example, the scan driver 110 may supply a scan signal to an (i−1)th (i is a positive integer) scan line Si−1 and an i-th scan line Si such that the scan signal overlaps with the light emitting control signal supplied to an i-th light emitting control signal Ei.

The data driver 120 supplies data signals to the data lines D1 to Dm by using the data driving control signal DCS. The data signals, supplied to the data lines D1 to Dm, are supplied to the pixels PXL selected by using the scan signals. For example, the data driver 120 may supply the data signal to the data lines D1 to Dm such that the data signal is synchronized with the scan signal.

Figure 2:
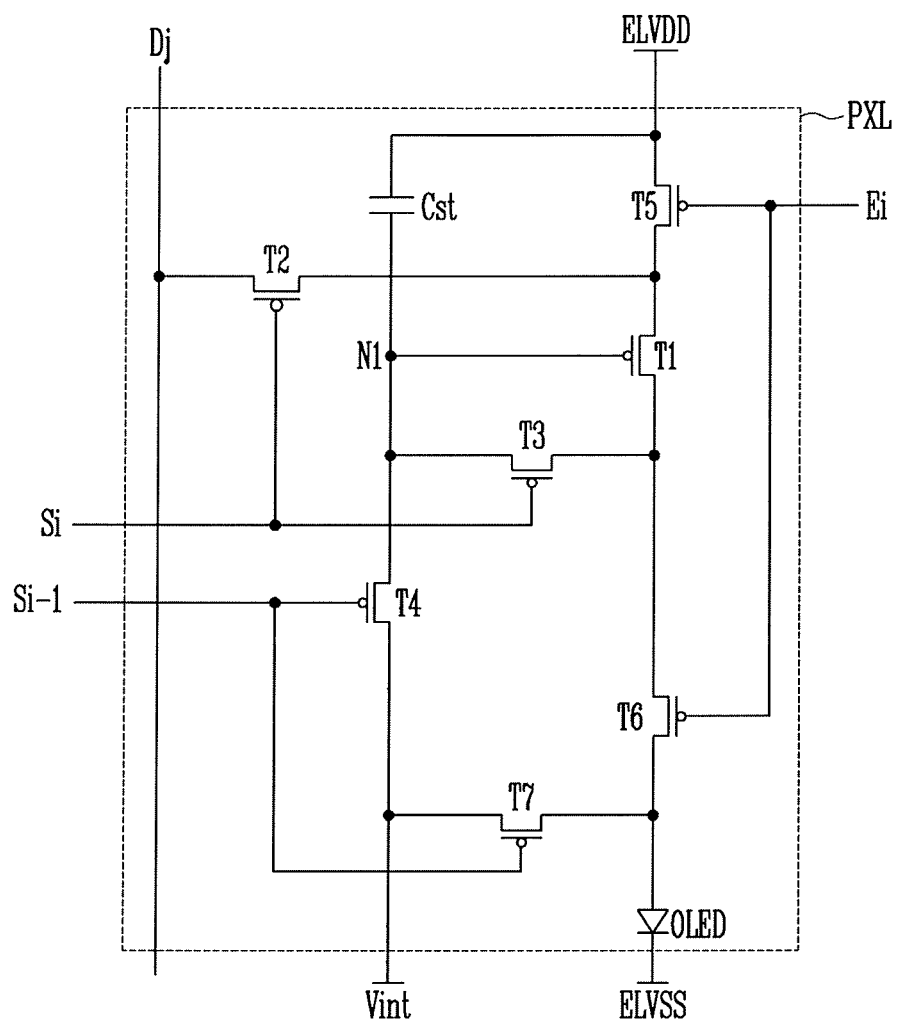
FIG. 2 is a plan view illustrating a circuit diagram of a pixel shown in FIG. 1, according to an exemplary embodiment of the present invention.

FIG. 2 is a plan view illustrating a circuit diagram of a pixel PXL shown in FIG. 1, according to an exemplary embodiment of the present invention. A pixel PXL located on an i-th (i is a positive integer smaller than n) row and a j-th (j is a positive smaller than m) column is illustrated in FIG. 2.

Referring to FIGS. 1 and 2, the pixel PXL may include a light emitting element OLED, first to seventh transistors T1 to T7, and a storage capacitor Cst.

An anode of the light emitting element OLED is connected to the first transistor T1 via the sixth transistor T6, and is connected to the second power source ELVSS. The light emitting element OLED may generate light with a predetermined luminance based on the amount of current supplied from the first transistor T1. In this case, the first power source ELVDD may be set to a higher voltage than the second power source ELVSS such that current can flow in the light emitting element OLED.

The seventh transistor T7 is connected between an initialization power source Vint and the anode of the light emitting element OLED. A gate electrode of the seventh transistor T7 is connected to an (i−1)th scan line Si−1. The seventh transistor T7 is turned on when an (i−1)th scan signal is supplied to the (i−1)th scan line Si−1 to supply a voltage of the initialization power source Vint to the anode of the light emitting element OLED. The initialization power source Vint may be set to a lower voltage than a data signal, but the present invention is not limited thereto.

The sixth transistor T6 is located between the first transistor T1 and the light emitting element OLED. The sixth transistor T6 may be connected to each of the first transistor T1 and the light emitting element OLED. A gate electrode of the sixth transistor T6 is connected to an i-th light emitting control line Ei. The sixth transistor T6 is turned off when an i-th light emitting control signal is supplied to the i-th light emitting control line Ei, and is otherwise turned on.

The fifth transistor T5 is located between the first power source ELVDD and the first transistor T1. The fifth transistor T5 may be connected to each of the first power source ELVDD and the first transistor T1. A gate electrode of the fifth transistor T5 is connected to the i-th light emitting control line Ei. The fifth transistor T5 is turned off when the i-th light emitting control signal is supplied to the i-th light emitting control line Ei, and is otherwise turned on.

A first electrode of the first transistor (e.g., a driving transistor) T1 is connected to the first power source ELVDD via the fifth transistor T5, and a second electrode of the first transistor T1 is connected to the anode of the light emitting element OLED via the sixth transistor T6. A gate electrode of the first transistor T1 is connected to a first node N1. The first transistor T1 controls the amount of current flowing from the first power source ELVDD to the second power source ELVSS via the light emitting element OLED based on a voltage of the first node N1.

The third transistor T3 is located between the first transistor T1 and the first node N1. The third transistor T3 may be connected to each of the first transistor T1 and the first node N1. The third transistor T3 is turned on when an i-th scan signal is supplied to an i-th scan line Si to allow the second electrode of the first transistor T1 to be electrically connected to the first node N1. Thus, the first transistor T1 can be diode-connected when the third transistor T3 is turned on.

The fourth transistor T4 is located between the first node N1 and the initialization power source Vint. The fourth transistor T4 may be connected to each of the first node N1 and the initialization power source Vint. The fourth transistor T4 is turned on when the (i−1)th scan signal is supplied to the (i−1)th scan line Si−1 to supply a voltage of the initialization power source Vint to the first node N1.

The second transistor (e.g., switching transistor) T2 is located between a j-th data line Dj and the first transistor T1. The second transistor T2 may be connected to each of the j-th data line Dj and the first electrode of the first transistor T1. In addition, the second transistor T2 is turned on when the i-th scan signal is supplied to the i-th scan line to allow the j-th data line Dj to be electrically connected to the first electrode of the first transistor T1. The second transistor T2 is turned on in response to the i-th scan signal provided through the i-th scan line Si to perform a switching operation of transmitting a data signal provided from the j-th data line Dj to the first electrode of the first transistor T1.

The storage capacitor Cst is located between the first power source ELVDD and the first node N1. The storage capacitor Cst may be connected to each of the first power source ELVDD and the first node N1. The storage capacitor Cst stores a voltage corresponding to a j-th data signal and a threshold voltage of the first transistor T1.

Figure 3:
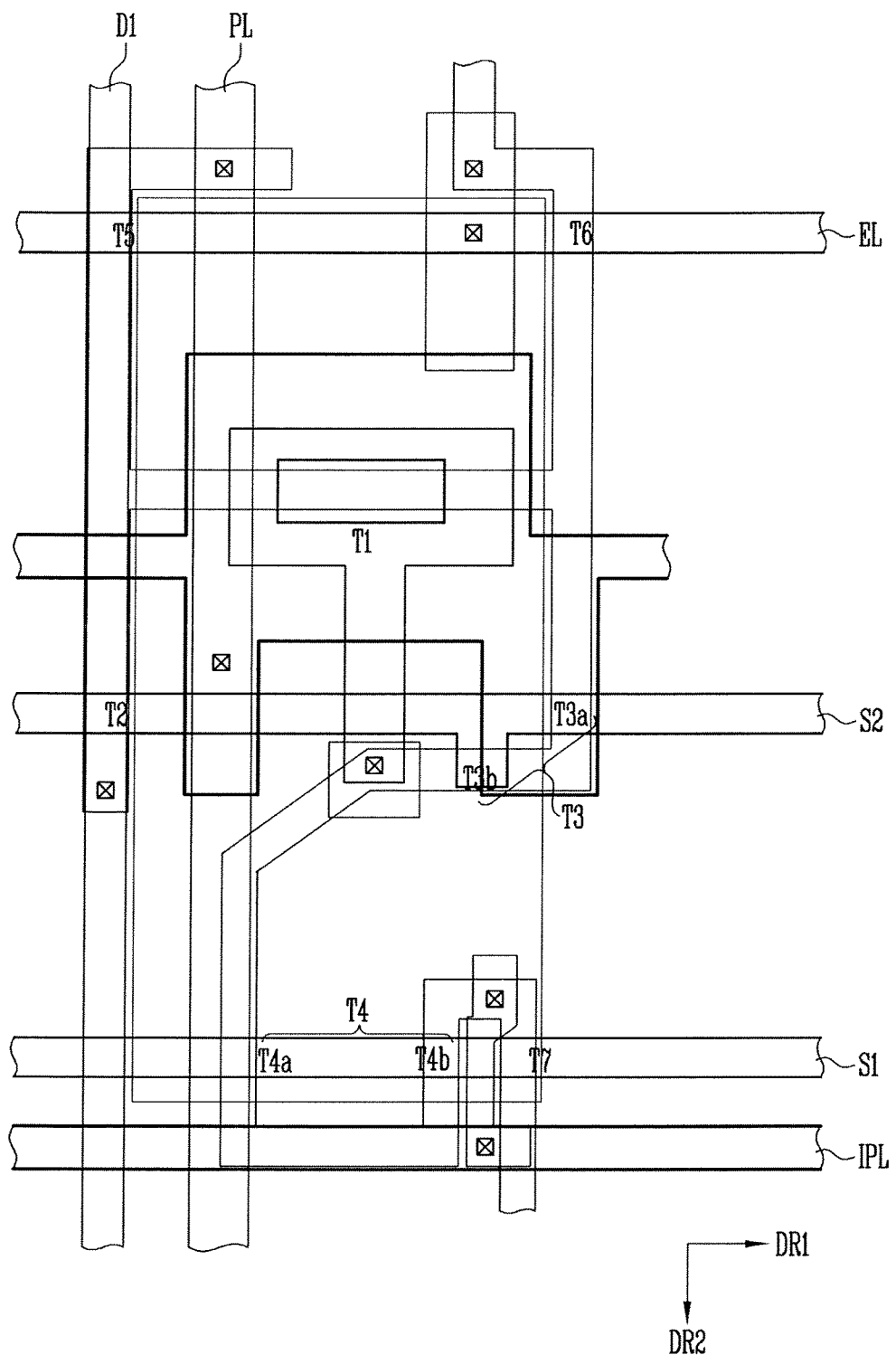
FIG. 3 is a plan view illustrating the pixel of FIG. 2, according to an exemplary embodiment of the present invention.
Figure 4:
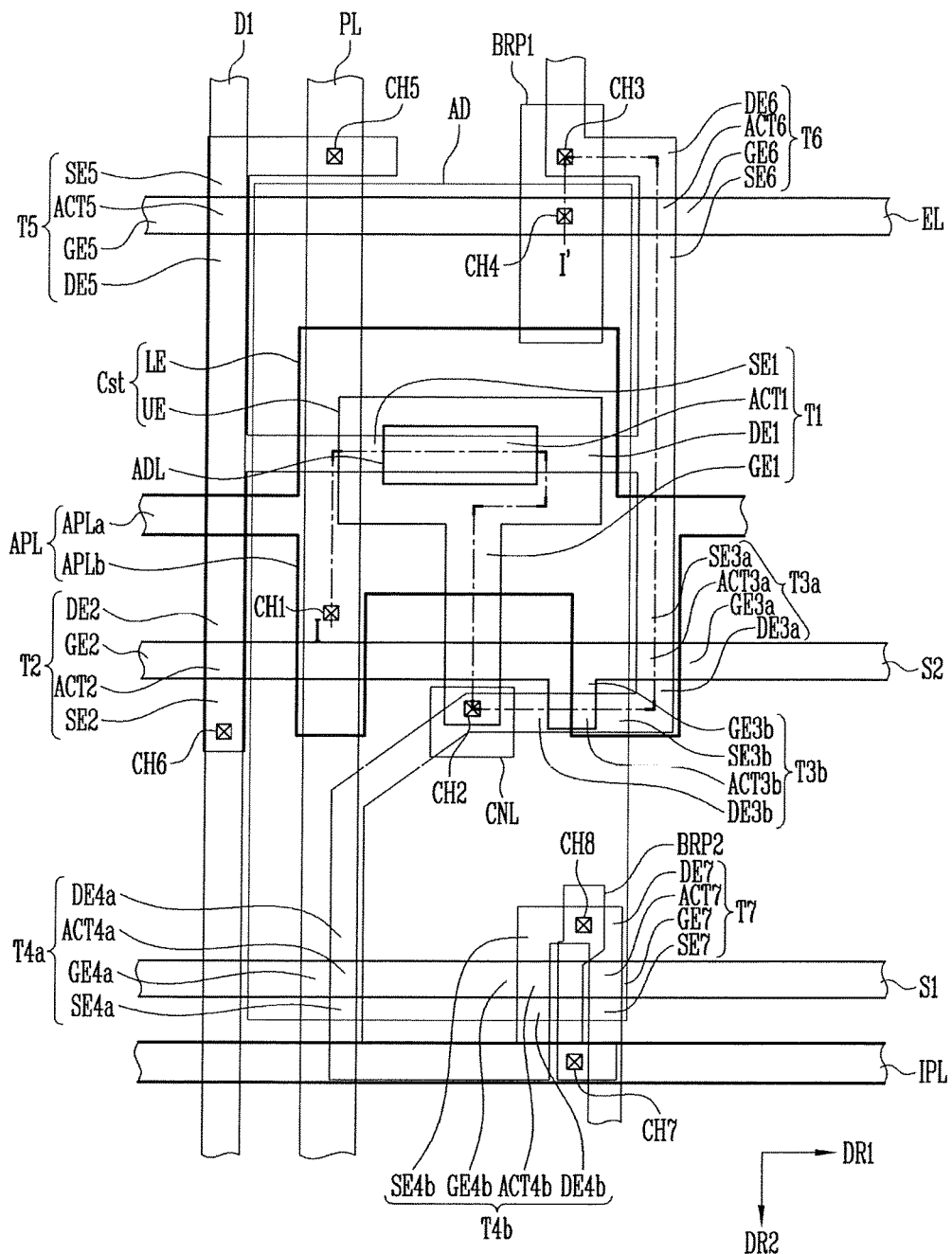
FIG. 4 is a plan view illustrating the pixel of FIG. 3 in more detail, according to an exemplary embodiment of the present invention.
Figure 5:
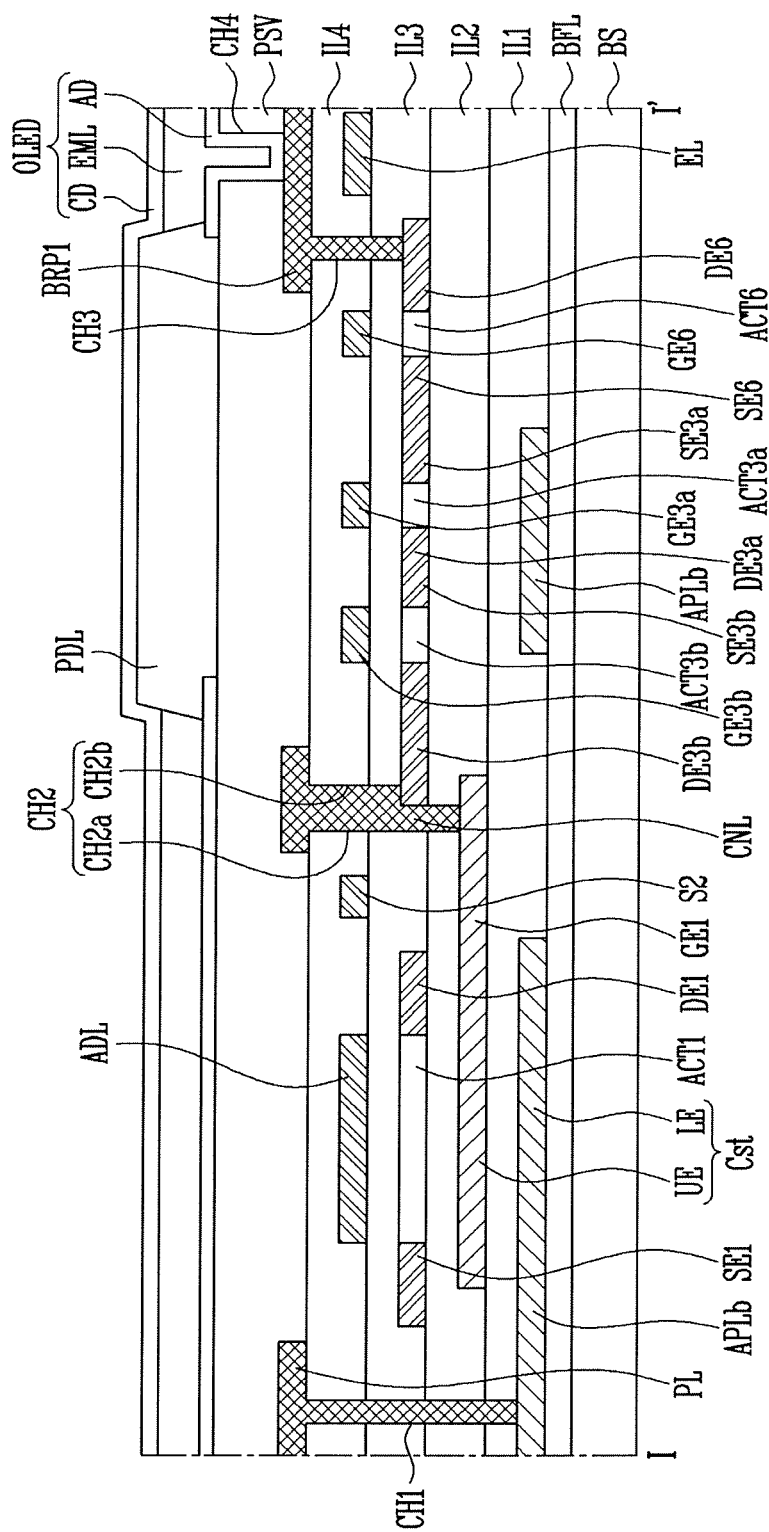
FIG. 5 is a sectional view taken along line I-I' of FIG. 4, according to an exemplary embodiment of the present invention.

FIG. 3 is a plan view illustrating the pixel of FIG. 2, according to an exemplary embodiment of the present invention. FIG. 4 is a plan view illustrating the pixel of FIG. 3 in more detail, according to an exemplary embodiment of the present invention. FIG. 5 is a sectional view taken along line I-I' of FIG. 4, according to an exemplary embodiment of the present invention. Scan lines, a light emitting control line, a power source line, and data lines are illustrated in FIGS. 3 and 4. In FIGS. 3 and 4, for convenience of description, a scan line on an (i−1)th row may be referred to as a "first scan line S1," a scan line on an i-th row may be referred to as a "second scan line S2," a data line on a j-th column may be referred to as a "data line D1," a light emitting control line on the i-th row may be referred to as a "light emitting control line EL," and a power source line on the j-th column may be referred to as a "power source line."

Referring to FIGS. 2 to 5, a display device includes a base substrate BS, a line part, and pixels PXL.

The base substrate BS may include an insulating material such as glass, organic polymer, or quartz. The base substrate BS may include a flexible material and may be bendable and/or foldable. The base substrate BS may have a single-layered structure or a multi-layered structure.

For example, the base substrate BS may include polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and/or cellulose acetate propionate. However, the materials included in the base substrate BS may be variously changed.

The line part provides a signal to each pixel PXL, and includes scan lines, a data line D1, a light emitting control line EL, a power source line PL, an initialization power source line IPL, and an auxiliary power source line APL.

The scan lines extend in a first direction DR1, and includes a first scan line S1 and a second scan line S2, which are sequentially arranged along a second direction DR2 intersecting the first direction D 1. Scan signals are provided to the scan lines. An (i−1)th scan signal is applied to the first scan line S1, and an i-th scan signal is applied to the second scan line S2.

The light emitting control line EL extends in the first direction DR1, and may be spaced part from the second scan line S2 at an upper side of the second scan line S2. A light emitting control signal is applied to the light emitting control line EL.

The power source line PL extends along the second direction DR2, and may be spaced apart from the data line D1. The power source line PL may be partially bent in a direction inclined with respect to the second direction DR2. However, the power source line PL may be entirely disposed along the second direction DR2. A first power source is applied to the power source line PL.

The initialization power source line IPL extends along the first direction DR1, and may be spaced apart from the first scan line Si at a lower side of the first scan line S1.

The auxiliary power source line APL is electrically connected to the power source line PL through a first contact hole CH1. Thus, the first power source is applied to the auxiliary power source line APL.

In plan view, the auxiliary power source line APL may include a first region APLa and a second region APLb, which protrude from a lower electrode LE of a storage capacitor Cst. The first region APLa may extend substantially in the same direction as the first and second scan lines S1 and S2, e.g., in the first direction DR1. The second region APLb may extend substantially in the same direction as the data line D1, e.g., in the second direction DR2. In an exemplary embodiment of the present invention, the first and second regions APLa and APLb of the auxiliary power source line APL may be disposed in a mesh form on the base substrate BS. When the first power source is provided to the auxiliary power source line APL in the mesh form, the first power source may be uniformly provided to the pixel unit (see 130 of FIG. 1) of the display device. Thus, the display device may have uniform luminance throughout the entire area of the pixel unit 130.

Each pixel PXL may include first to seventh transistors T1 to T7, a storage capacitor Cst, a light emitting element OLED, and bridge patterns.

The first transistor T1 includes a first gate electrode GE1, a first active pattern ACT1, a first source electrode SE1, a first drain electrode DE1, and a connection line CNL.

The first gate electrode GE1 is connected to a third drain electrode DE3 of the third transistor T3 and a fourth drain electrode DE4 of the fourth transistor T4. The connection line CNL connects the first gate electrode GE1 to each of the third drain electrode DE3 and the fourth drain electrode DE4. The connection line CNL connects the first gate electrode GE1 to each of the third drain electrode DE3 and the fourth drain electrode DE4 through a second contact hole CH2.

In plan view, the gate electrode GE1 extends along the second direction DR2, and may be integrally formed with an upper electrode UE of the storage capacitor Cst. For example, the first gate electrode GE1 may be disposed in the same layer as the upper electrode UE.

In an exemplary embodiment of the present invention, the first active pattern ACT1, the first source electrode SE1, and the first drain electrode DE1 may include a semiconductor layer which is undoped or doped with impurities. The source electrode SE1 and the first drain electrode DE1 may include a semiconductor layer doped with impurities, and the first active pattern ACT1 may include a semiconductor layer undoped with impurities.

The first active pattern ACT1 may have a bar shape extending in a predetermined direction, but the present invention is not limited thereto. For example, the first active pattern ACT1 may have a shape bent multiple times along the direction in which it primarily extends. In plan view, the first active pattern ACT1 may partially overlap with the first gate electrode GE1.

The first source electrode SE1 is connected to a first end of the first active pattern ACT1, and is connected to each of a second drain electrode DE2 of the second transistor T2 and a fifth drain electrode DE5 of the fifth transistor T5. The first drain electrode DE1 is connected to a second end of the first active pattern ACT1, and is connected to each of a third source electrode SE3 of the third transistor T3 and a sixth source electrode SE6 of the sixth transistor T6.

The second transistor T2 includes a second gate electrode GE2, a second active pattern ACT2, a second source electrode SE2, and the second drain electrode DE2.

The second gate electrode GE2 is connected to the second scan line S2. The second gate electrode GE2 may be provided as a portion of the second scan line S2, but the present invention is not limited thereto. For example, the second gate electrode GE2 may be provided in a shape protruding from the second scan line S2. In an exemplary embodiment of the present invention, the second active pattern ACT2, the second source electrode SE2, and the second drain electrode DE2 may include a semiconductor layer which is undoped or doped with impurities. The second active pattern ACT2 corresponds to a portion overlapping with the second gate electrode GE2. A first end of the second source electrode SE2 is connected to the second active pattern ACT2, and a second end of the second source electrode SE2 is connected to the data line D1 through a sixth contact hole CH6. A first end of the second drain electrode DE2 is connected to the second active pattern ACT2, and a second end of the second drain electrode DE2 is connected to the first source electrode SE1 of the first transistor T1 and the fifth drain electrode DE5 of the fifth transistor T5.

The third transistor T3 may be provided in a dual gate structure to prevent leakage current. For example, the third transistor T3 may include a 3a-th transistor T3a and a 3b-th transistor T3b. The 3a-th transistor T3a may include a 3a-th gate electrode GE3a, a 3a-th active pattern ACT3a, a 3a-th source electrode SE3a, and a 3a-th drain electrode DE3a. The 3b-th transistor T3b may include a 3b-th gate electrode GE3b, a 3b-th active pattern ACT3b, a 3b-th source electrode SE3b, and a 3b-th drain electrode DE3b. Hereinafter, for convenience of description, the 3a-th gate electrode GE3a and the 3b-th gate electrode GE3b may be referred to as a third gate electrode GE3, the 3a-th active pattern ACT3a and the 3b-th active pattern ACT3b may be referred to as a third active pattern ACT3, the 3a-th source electrode SE3a and the 3b-th source electrode SE3b may be referred to as a third source electrode SE3, and the 3a-th drain electrode DE3a and the 3b-th drain electrode DE3b may be referred to as a third drain electrode DE3.

The third gate electrode GE3 is connected to the second scan line S2. The third gate electrode GE3 is provided as a portion of the second scan line S2 or provided in a shape protruding from the second scan line S2. In an exemplary embodiment of the present invention, the third active pattern AC3, the third source electrode SE3, and the third drain electrode DE3 may include a semiconductor layer which is undoped or doped with impurities. The third source electrode SE3 and the third drain electrode DE3 may include a semiconductor layer doped with impurities, and the third active pattern ACT may include a semiconductor layer undoped with impurities. The third active pattern ACT3 corresponds to a portion overlapping with the third gate electrode GE3. A first end of the third source electrode SE3 is connected to the third active pattern ACT, and a second end of the third source electrode SE3 is connected to the first drain electrode DE1 of the first transistor T1 and the sixth source electrode SE6 of the sixth transistor T6. A first end of the third drain electrode DE3 is connected to the third active pattern ACT3, and a second end of the third drain electrode DE3 is connected to the fourth drain electrode DE4 of the fourth transistor T4. Also, the third drain electrode DE3 is connected to the first gate electrode GE1 of the first transistor T1 through the connection line CNL and the second contact hole CH2.

The fourth transistor T4 may be provided in a dual gate structure to prevent leakage current. For example, the fourth transistor T4 may include a 4a-th transistor T4a and a 4b-th transistor T4b. The 4a-th transistor T4a may include a 4a-th gate electrode GE4a, a 4a-th active pattern ACT4a, a 4a-th source electrode SE4a, and a 4a-th drain electrode DE4a. The 4b-th transistor T4b may include a 4b-th gate electrode GE4b, a 4b-th active pattern ACT4b, a 4b-th source electrode SE4b, and a 4b-th drain electrode DE4b. Hereinafter, for convenience of description, the 4a-th gate electrode GE4a and the 4b-th gate electrode GE4b may be referred to as a fourth gate electrode, the 4a-th active pattern ACT4a and the 4b-th active pattern ACT4b may be referred to as a fourth active pattern, the 4a-th source electrode SE4a and the 4b-th source electrode SE4b may be referred to as a fourth source electrode, and the 4a-th drain electrode DE4a and the 4b-th drain electrode DE4b may be referred to as a fourth drain electrode.

The fourth gate electrode GE4 is connected to the first scan line S1. The fourth gate electrode GE4 is provided as a portion of the first scan line S1 or provided in a shape protruding from the first scan line S1. In an exemplary embodiment of the present invention, the fourth active pattern ACT, the fourth source electrode SE4, and the fourth drain electrode DE4 may include a semiconductor layer which is undoped or doped with impurities. The fourth source electrode SE4 and the fourth drain electrode DE4 may include a semiconductor layer doped with impurities, and the fourth active pattern ACT4 may include a semiconductor layer undoped with impurities. The fourth active pattern ACT4 corresponds to a portion overlapping with the fourth gate electrode GE4. A first end of the fourth source electrode SE4 is connected to the fourth active pattern ACT4, and a second end of the fourth source electrode SE4 is connected to the initialization power source line IPL and a seventh drain electrode DE7 of the seventh transistor T7. Since a second bridge pattern BRP2 is provided between the fourth source electrode SE4 and the initialization power source line IPL, a first end of the second bridge pattern BRP2 is connected to the fourth source electrode SE4 through an eighth contact hole CH8, and a second end of the second bridge pattern BRP2 is connected to the initialization power source line IPL through a seventh contact hole CH7. A first end of the fourth drain electrode DE4 is connected to the fourth active pattern ACT4, and a second end of the fourth drain electrode DE4 is connected to the third drain electrode DE3 of the third transistor T3. Also, the fourth drain electrode DE4 is connected to the first gate electrode GE1 of the first transistor T1 through the connection line CNL and the second contact hole CH2.

The fifth transistor T5 includes a fifth gate electrode GE5, a fifth active pattern ACT5, a fifth source electrode SE5, and the fifth drain electrode DE5.

The fifth gate electrode GE5 is connected to the light emitting control line EL. The fifth gate electrode GE5 is provided as a portion of the light emitting control line EL or provided in a shape protruding from the light emitting control line EL. In an exemplary embodiment of the present invention, the fifth active pattern ACT 5, the fifth source electrode SE5, and the fifth drain electrode DE5 may include a semiconductor layer which is undoped or doped with impurities. The fifth source electrode SE5 and the fifth drain electrode DE5 may include a semiconductor layer doped with impurities, and the fifth active pattern ACT5 may include a semiconductor undoped with impurities. The fifth active pattern ACT5 corresponds to a portion overlapping with the fifth gate electrode GE5. A first end of the fifth source electrode SE5 is connected to the fifth active pattern ACT5, and a second end of the fifth source electrode SE5 is connected to the power source line PL through a fifth contact hole CH5. A first end of the fifth drain electrode DE5 is connected to the fifth active pattern ACT5, and a second end of the fifth drain electrode DE5 is connected to the first source electrode SE1 of the first transistor T1 and the second drain electrode DE2 of the second transistor T2.

The sixth transistor T6 includes a sixth gate electrode GE6, a sixth active pattern ACT6, the sixth source electrode SE6, and a sixth drain electrode DE6.

The sixth gate electrode GE6 is connected to the light emitting control line EL. The sixth gate electrode GE6 is provided as a portion of the light emitting control line EL or provided in a shape protruding from the light emitting control line EL. In an exemplary embodiment of the present invention, the sixth active pattern ACT6, the sixth source electrode SE6, and the sixth drain electrode DE6 may include a semiconductor layer which is doped or undoped with impurities. The sixth source electrode SE6 and the sixth drain electrode DE6 may include a semiconductor layer doped with impurities, and the sixth active pattern ACT6 may include a semiconductor layer undoped with impurities. The sixth active pattern ACT6 corresponds to a portion overlapping with the sixth gate electrode GE6. A first end of the sixth source electrode SE6 is connected to the sixth active pattern ACT6, and a second end of the sixth source electrode SE6 is connected to the first drain electrode DE1 of the first transistor T1 and the third source electrode SE3 of the third transistor T3. A first end of the sixth drain electrode DE6 is connected to the sixth active pattern ACT6, and a second end of the sixth drain electrode DE6 is connected to a seventh source electrode SE7 of a seventh transistor T7 of a pixel on a previous row.

The seventh transistor T7 includes a seventh gate electrode GE7, a seventh active pattern AC7, the seventh source electrode SE7, and the seventh drain electrode DE7.

The seventh gate electrode GE7 is connected to the first scan line S1. The seventh gate electrode GE7 is provided as a portion of the first scan line S1 or provided in a shape protruding from the first scan line S1. In an exemplary embodiment of the present invention, the seventh active pattern ACT7, the seventh source electrode SE7, and the seventh drain electrode DE7 may include a semiconductor layer which is undoped or doped with impurities. The seventh source electrode SE7 and the seventh drain electrode DE7 may include a semiconductor layer doped with impurities, and the seventh active pattern ACT7 may include a semiconductor layer undoped with impurities. A first end of the seventh active pattern ACT7 corresponds to a portion overlapping with the seventh gate electrode GE7. A first end of the seventh source electrode SE7 is connected to the seventh active pattern ACT7, and a second end of the seventh source electrode SE7 is connected to a sixth drain electrode SE6 of a sixth transistor T6 of a pixel disposed in an adjacent row. A first end of the seventh drain electrode DE7 is connected to the seventh active pattern ACT7, and a second end of the seventh drain electrode DE7 is connected to the initialization power source line IPL.

In addition, the seventh drain electrode DE7 is connected to the fourth source electrode DE4 of the fourth transistor T4. The seventh drain electrode DE7 and the initialization power source line IPL may be connected through the second bridge pattern BRP2, the seventh contact hole CH7, and the eighth contact hole CH8.

The storage capacitor Cst includes a lower electrode LE and an upper electrode UE.

The lower electrode LE is disposed in the same layer as the auxiliary power source line APL, and may be integrally formed with the auxiliary power source line APL. Therefore, the lower electrode LE is electrically connected to the power source line PL through the auxiliary power source line APL and the first contact hole CH1. Therefore, a voltage having the same level as the first power source may be applied to the lower electrode LE. The lower electrode LE may be disposed between the base substrate BS and the upper electrode UE.

The upper electrode UE may be formed with the first gate electrode GE1 of the first transistor T1. The upper electrode UE may be integrally formed with the first gate electrode GE1, and partially overlaps with the lower electrode LE in plan view. The overlapping area of the upper electrode UE and the lower electrode LE is increased, so that the capacitance of the storage capacitor Cst can be increased.

A portion of the upper electrode UE may extend along the second direction DR2. The portion of the upper electrode UE which extends along the second direction DR2 may be the first gate electrode GE1. In addition, a portion of the first gate electrode GE1 may not overlap with the lower electrode LE in plan view. The second contact hole CH2 may be provided in a region in which the lower electrode LE and the portion of the first gate electrode GE1 do not overlap with each other. For example, the second contact hole CH2 may be provided in the area in which the lower electrode LE and the portion of the first gate electrode GE1 do not overlap with each other. For example, the second contact hole CH2 might not be disposed in an area of the storage capacitor Cst, which is an area where the lower electrode LE and the upper electrode UE overlap with each other.

In comparison to a display device, according to an approach, in which a contact hole is provided in a region of a storage capacitor Cst to connect a driving transistor to a connection line, in a display device according to an exemplary embodiment of the present invention, the second contact hole CH2 is disposed in a region in which the upper electrode UE and the lower electrode LE do not overlap with each other. Accordingly, the spatial and/or structural limitations (e.g., the complexity of the structure) of the region in which the storage capacitor Cst is disposed may be reduced. As the spatial and/or structural limitations of the region in which the storage capacitor Cst is disposed are reduced, a display device having a high resolution may be manufactured quickly and efficiently.

The light emitting element OLED includes an anode electrode AD, a cathode electrode CD, and a light emitting layer EML disposed between the anode electrode AD and the cathode electrode CD.

The anode electrode AD is provided in a pixel region corresponding to each pixel PXL. The anode electrode AD is connected to the seventh drain electrode DE7 of the seventh transistor T7 and the sixth drain electrode DE6 of the sixth transistor T6 through a third contact hole CH3 and a fourth contact hole CH4. A first bridge pattern BRP1 is provided between the third contact hole CH3 and the fourth contact hole CH4 to connect the anode electrode AD to the sixth drain electrode DE6 and the seventh drain electrode DE7.

A stacking order of the elements of the display device will be described with reference to FIGS. 2 to 5.

A buffer layer BFL may be disposed on the base substrate BS.

The auxiliary power source line APL, the storage capacitor Cst, the lower electrode LE, and the initialization power source line IPL may be disposed on the buffer layer BFL. The auxiliary power source line APL, the storage capacitor Cst, the lower electrode LE, and the initialization power source line IPL may include a metallic material. The auxiliary power source line APL may be integrally formed with the lower electrode LE of the storage capacitor Cst.

A first insulating layer IL1 may be provided over the auxiliary power source line APL, the storage capacitor Cst, the lower electrode LE, and the initialization power source line IPL.

The upper electrode UE of the storage capacitor Cst and the first gate electrode GE1 may be disposed on the first insulating layer IL1. The first gate electrode GE1 may be integrally formed with the upper electrode UE. The upper electrode UE overlaps with the lower electrode LE, and the upper electrode UE and the lower electrode LE may constitute the storage capacitor Cst with the first insulating layer IL1 interposed therebetween.

A second insulating layer IL2 may be provided over the upper electrode UE of the storage capacitor Cst and the first gate electrode GE1.

The first to seventh active patterns ACT1 to ACT7 may be disposed on the second insulating layer IL2. The first to seventh active patterns ACT1 to ACT7 may include a semiconductor material.

A third insulating layer IL3 may be provided over the first to seventh active patterns ACT1 to ACT7.

The first scan line S1, the second scan line S2, the light emitting control line EL, and the second to seventh gate electrodes GE2 to GE7 may be disposed on the third insulating layer IL3. The second gate electrode GE2 and the third gate electrode GE3 may be integrally formed with the second scan line S2. The fourth gate electrode GE4 and the seventh gate electrode GE7 may be integrally formed with the first scan line S1. The fifth gate electrode GE5 and the sixth gate electrode GE6 may be integrally formed with the light emitting control line EL.

In addition, an anti-doping layer ADL may be disposed on the third insulating layer IL3. The anti-doping layer ADL may serve as a blocking layer that may prevent the first active pattern ACT1 of the first transistor T1 from being doped by impurities. Accordingly, the anti-doping layer ADL can define a channel region of the first active pattern ACT1.

The anti-doping layer ADL may be provided in the same layer as the first scan line S1, and the like. The anti-doping layer ADL may include a metallic material and/or a photosensitive material. In an exemplary embodiment of the present invention, since the anti-doping layer ADL is provided in the same layer as the first and second scan lines S1 and S2, the light emitting control line EL, and the second to seventh gate electrodes GE2 to GE7, the anti-doping layer may include a metallic material.

A fourth insulating layer IL4 may be provided over the first and second scan lines S1 and S2, the light emitting control line EL, the second to seventh gate electrodes GE2 to GE7, and the anti-doping layer ADL.

The data line D1, the power source line PL, the connection line CNL, and the first bridge pattern BRP1 may be disposed on the fourth insulating layer IL4.

The data line D1 may be connected to the second source electrode SE2 through the sixth contact hole CH6. Although not shown in the figures, the sixth contact hole CH6 may be an opening that passes through the third and fourth insulating layers IL3 and IL4.

The power source line PL may be connected to the auxiliary power source line APL through the first contact hole CH1, which passes through the first to fourth insulating layers IL1 to IL4. The power source line PL may also be connected to the fifth source electrode SE5 through the fifth contact hole CH5. Although not shown in the figures, the fifth contact hole CH5 may be an opening that passes through the third and fourth insulating layer IL3 and IL4.

The connection line CNL is connected to the first gate electrode GE1 through a first side CH2a of the second contact hole CH2, that passes through the second to fourth insulating layers IL2 to IL4. The connection line CNL may also be connected to the third drain electrode DE3 through a second side CH2b of the second contact hole CH2, that passes through the third insulating layer IL3 and the fourth insulating layer IL4.

The first bridge pattern BRP1 is a pattern provided as a medium that connects the sixth drain electrode DE6 to the anode electrode AD. The first bridge pattern BRP1 may be disposed between the sixth drain electrode DE6 and the anode electrode AD. The first bridge pattern BRP1 may be connected to the sixth drain electrode DE6 through the third contact hole CH3, that passes through the third and fourth insulating layers IL3 and IL4.

In addition, the second bridge pattern BRP2 may be disposed on the fourth insulating layer IL4. The second bridge pattern BRP2 is a pattern provided as a medium that connects the fourth source electrode SE4 to the initialization power source line IPL. The second bridge pattern BRP2 may be disposed between the fourth source electrode SE4 and the initialization power source line IPL. The second bridge pattern BRP2 may be connected to the fourth source electrode SE4 and the seventh drain electrode DE7 through the seventh and eighth contact holes CH7 and CH8.

A passivation layer PSV may be disposed on the base substrate BS, on which the data line D1 and the like are formed.

The anode electrode AD may be disposed on the passivation layer PSV. The anode electrode AD may be connected to the first bridge pattern BRP1 through the fourth contact hole CH4, that passes through the passivation layer PSV. Since the first bridge pattern BRP1 is connected to the sixth drain electrode DE6 and the seventh source electrode SE7 through the third contact hole CH3, the anode electrode AD may be connected to the sixth drain electrode DE6 and the seventh source electrode SE7.

A pixel defining layer PDL that defines a pixel region to correspond to each pixel PXL may be provided on the base substrate BS on which the anode electrode AD and the like are formed. The pixel defining layer PDL exposes the top surface of the anode electrode AD, and may be disposed on the base substrate BS along the circumference or perimeter of the pixel PXL.

The light emitting layer EML may be provide in the pixel region and may be surrounded by the pixel defining layer PDL. The cathode electrode CD may be disposed on the light emitting layer EML.

An encapsulation layer that covers the cathode electrode CD may be provided over the cathode electrode CD.

According to an exemplary embodiment of the present invention, when the upper electrode UE and the lower electrode LE, which constitute the storage capacitor Cst, are disposed under the first to seventh active patterns ACT1 to ACT7, the structural limitations (e.g., the complexity of the structure) of the storage capacitor Cst can be reduced.

In addition, according to an exemplary embodiment of the present invention, when the upper electrode UE is integrally formed with the first gate electrode GE1 of the first transistor T1, that is a driving transistor, the second insulating layer IL2, provided between the first gate electrode GE1 and the first active pattern ACT1, is not influenced by a protrusion of the first active pattern ACT1. Thus, the thickness of the second insulating layer IL2, that is a gate insulating layer, can be decreased. As the thickness of the second insulating layer IL2 is decreased, an instantaneous afterimage phenomenon of the display device can be reduced.

In addition, according to an exemplary embodiment of the present invention, the lower electrode LE and the upper electrode UE, which are disposed under the first active pattern ACT1, can serve as a light blocking layer. For example, in the case of a transparent display device in which light is transmitted through the rear thereof, the lower electrode LE and the upper electrode UE block light transmitted through the rear of the base substrate BS. Accordingly, light may be prevented from advancing toward the first active pattern ACT1.

FIGS. 6A, 7A, 8A, 9A, 10A and 11A are plan views illustrating components of each layer of the pixel of FIG. 4, according to an exemplary embodiment of the present invention. FIGS. 6B, 7B, 8B, 9B, 10B and 11B are sectional views sequentially illustrating a manufacturing method of the pixel of FIG. 5, according to an exemplary embodiment of the present invention.

Figure 6A:
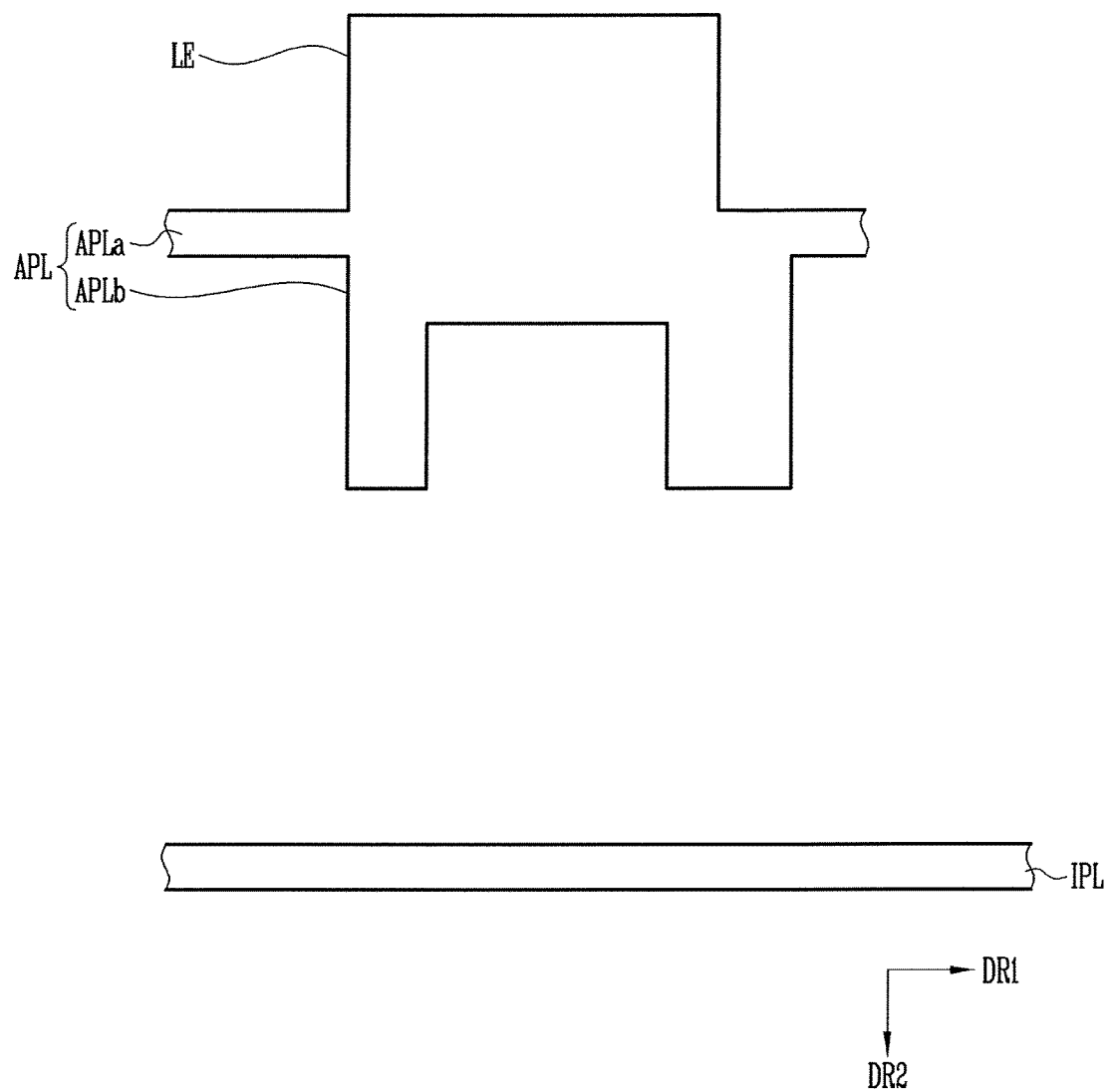
FIGS. 6A, 7A, 8A, 9A, 10A and 11A are plan views illustrating components of each layer of the pixel of FIG. 4, according to an exemplary embodiment of the present invention.

Referring to FIGS. 6A and 6B, a lower electrode LE of a storage capacitor (see Cst of FIG. 4), an auxiliary power source line APL, and an initialization power source line IPL are formed on a base substrate BS, on which a buffer layer BFL is provided.

The buffer layer BFL prevents impurities from being diffused from the base substrate BS and can increase the flatness of the base substrate BS. The buffer layer BFL may be provided in a single layer or in multiple layers including at least two layers. The buffer layer BFL may include an inorganic insulating layer containing an inorganic material. For example, the buffer layer BFL may include silicon nitride, silicon oxide, silicon oxynitride, or the like. When the buffer layer BFL is provided in multiple layers, the layers may include the same material or may include different materials with respect to each other. The buffer layer BFL may be omitted depending on the material(s) and process conditions of the base substrate BS.

The auxiliary power source line APL may be integrally formed with the lower electrode LE. In plan view, the auxiliary power source line APL may include a first region APLa extending from the lower electrode LE along a first direction DR1 and a second region APLb extending from the lower electrode LE along a second direction DR2 intersecting the first direction DR1.

Figure 7A:
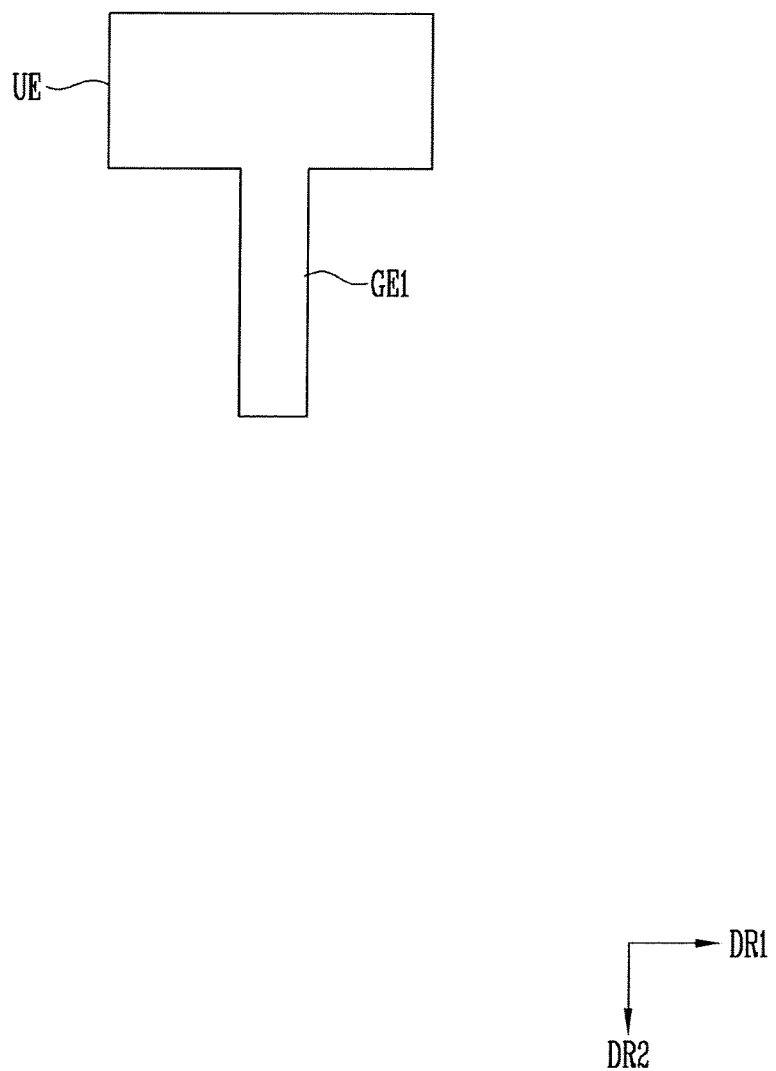

Referring to FIGS. 7A and 7B, a first insulating layer IL1 is formed over the lower electrode LE, the auxiliary power source line APL, and the initialization power source line IPL. The first insulating layer IL1 may be an inorganic insulating layer including an inorganic material. The inorganic material may include inorganic insulating materials including silicon nitride, silicon oxide, silicon oxynitride, and the like. Alternatively, the first insulating layer IL1 may be an organic insulating layer including an organic material. The organic material may include organic insulating materials, for example, a polyacryl-based compound, a polyimide-based compound, a fluorine-based compound such as Teflon, a benzocyclobutene-based compound, and the like.

An upper electrode of the storage capacitor Cst and a first gate electrode are formed on the first insulating layer IL1.

The upper electrode UE and the first gate electrode GE1 may be integrally formed. The upper electrode UE may overlap with the lower electrode LE between the first insulating layer IL1 interposed therebetween. The upper electrode UE overlaps with the lower electrode LE. The upper electrode UE and the lower electrode LE may constitute the storage capacitor Cst with the first insulating layer IL1 interposed therebetween.

In plan view, the first gate electrode GE1 may extend from the upper electrode UE along the second direction DR2.

Figure 8A:
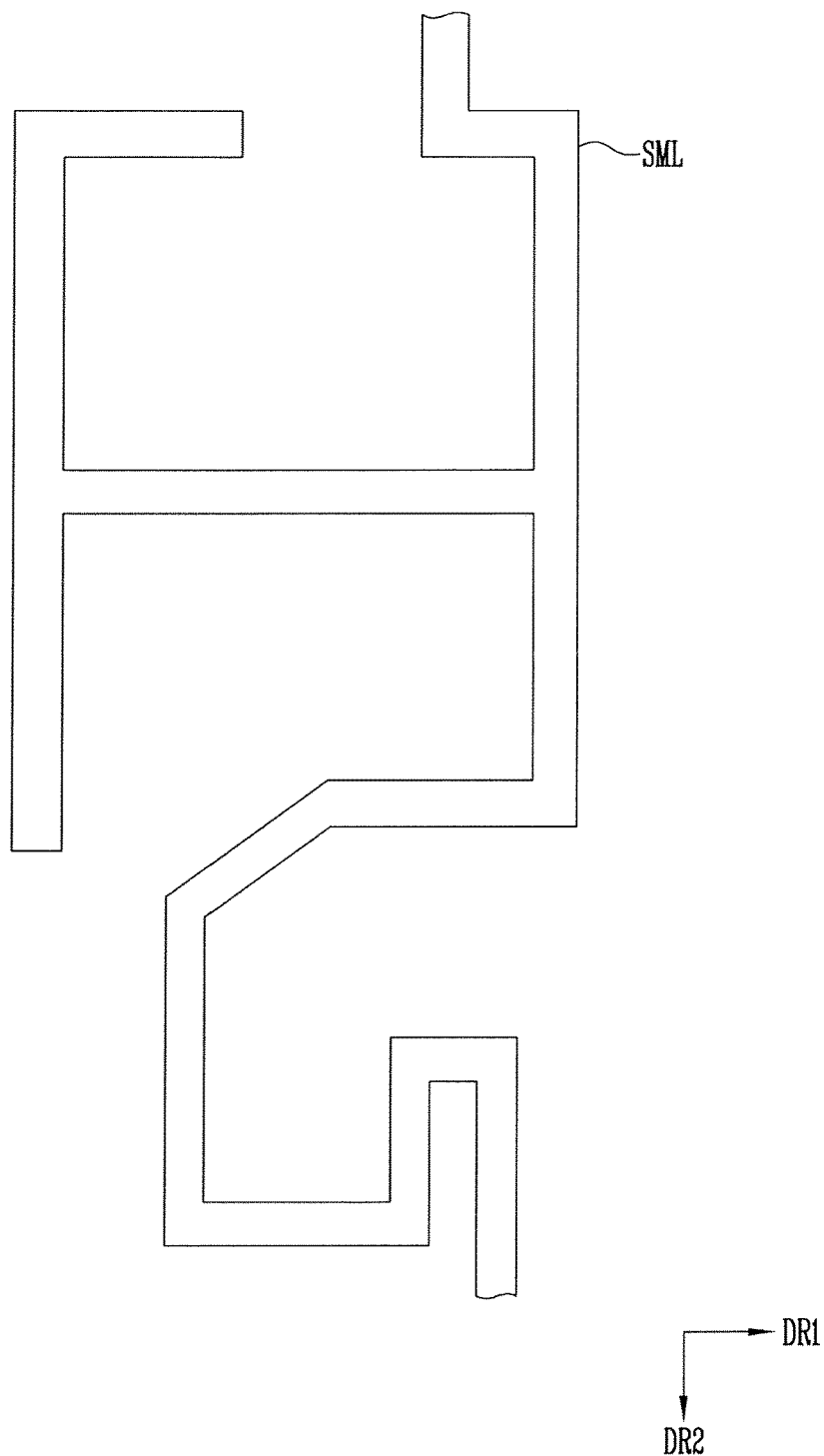

Referring to FIGS. 8A and 8B, a second insulating layer IL2 is formed over the upper electrode UE and the first gate electrode GE1. The second insulating layer IL2 may be an inorganic insulating material including an inorganic material, but the present invention is not limited thereto. For example, the second insulating layer IL2 may be an organic insulating layer including an organic material.

A semiconductor layer SML is formed on the second insulating layer IL2. The semiconductor layer SML may include polysilicon, amorphous silicon, an oxide semiconductor, an organic semiconductor material, or the like. The semiconductor layer SML may include a semiconductor material undoped with impurities.

Figure 9A:
Figure 9A:
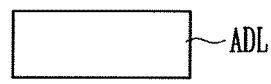
Figure 9A:
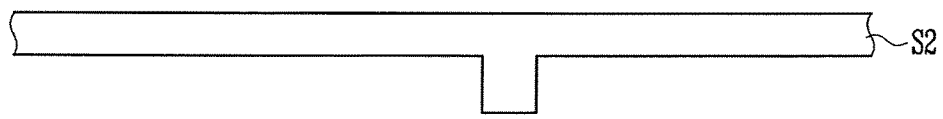
Figure 9A:
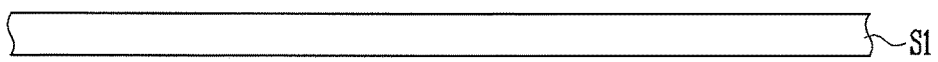
Figure 9A:
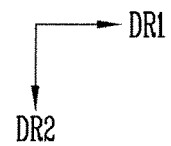
Figure 9B:
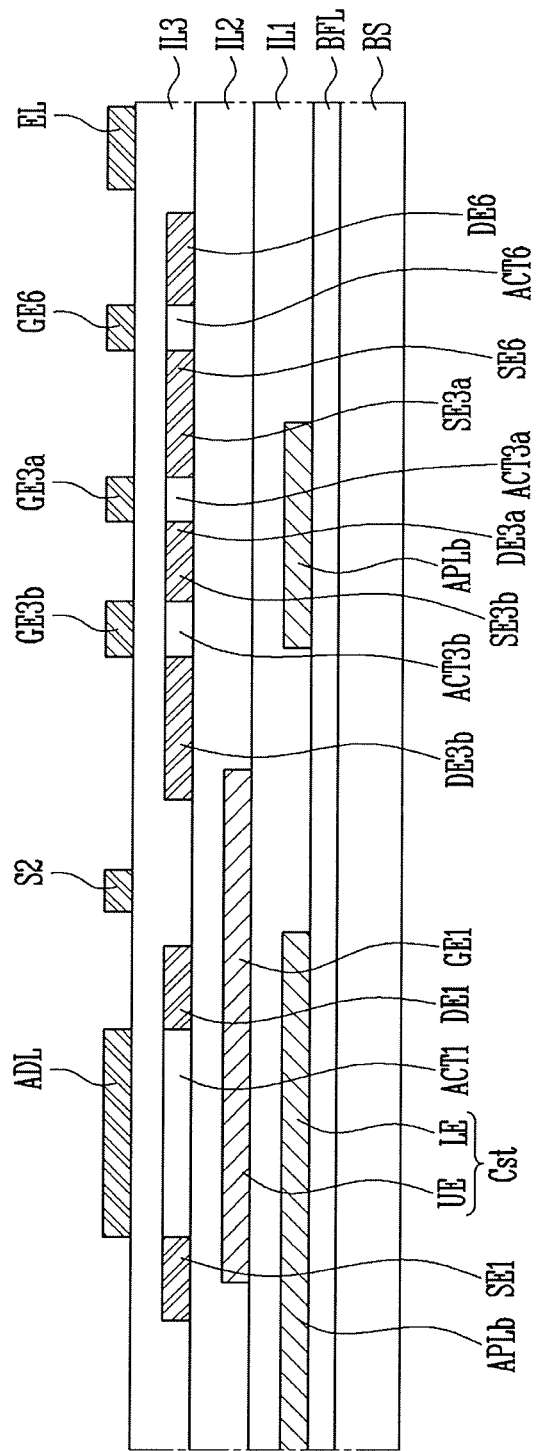

Referring to FIGS. 9A and 9B, a third insulating layer IL3 is formed over the semiconductor layer (see SML of FIG. 8A). The third insulating layer IL3 may include an inorganic insulating material including an inorganic material and/or an organic insulating material including an organic material.

A light emitting control line EL, a first scan line S1, a second scan line S2, and an anti-doping layer ADL are formed on the third insulating layer IL3. In plan view, the light emitting control line EL and the first and second scan lines S1 and S2 may extend along the first direction DR1. The anti-doping layer ADL may overlap with the upper electrode UE of the storage capacitor Cst.

In addition, a third gate electrode GE3a and GE3b and a sixth gate electrode GE6 are formed on the third insulating layer IL3. The third gate electrode GE3a and GE3b may be integrally formed with the second scan line S2. The sixth gate electrode GE6 may be integrally formed with the light emitting control line EL.

The light emitting control line EL, the first scan line S1, the second scan line S2, the anti-doping layer ADL, the third gate electrodes GE3a and GE3b, and the sixth gate electrode GE6 may overlap with the semiconductor layer SML.

Then, impurities are doped on the base substrate BS, on which the light emitting control line EL, the first scan line S1, the second scan line S2, the anti-doping layer ADL, the third gate electrode GE3a and GE3b, and the sixth gate electrode GE6 are formed. The semiconductor layer SML, overlapping with the third gate electrodes GE3a and GE3b, may become third active patterns ACT3a and ACT3b. The third active patterns ACT3a and ACT3b may be undoped with the impurities. The semiconductor layer SML, overlapping with the sixth gate electrode GE6, may become a sixth active pattern ACT6. The sixth active pattern ACT6 may be undoped with the impurities. In addition, the semiconductor layer SML, overlapping with the anti-doping layer ADL, may become a first active pattern ACT1. The first active pattern ACT1 may be undoped with the impurities.

Figure 10A:
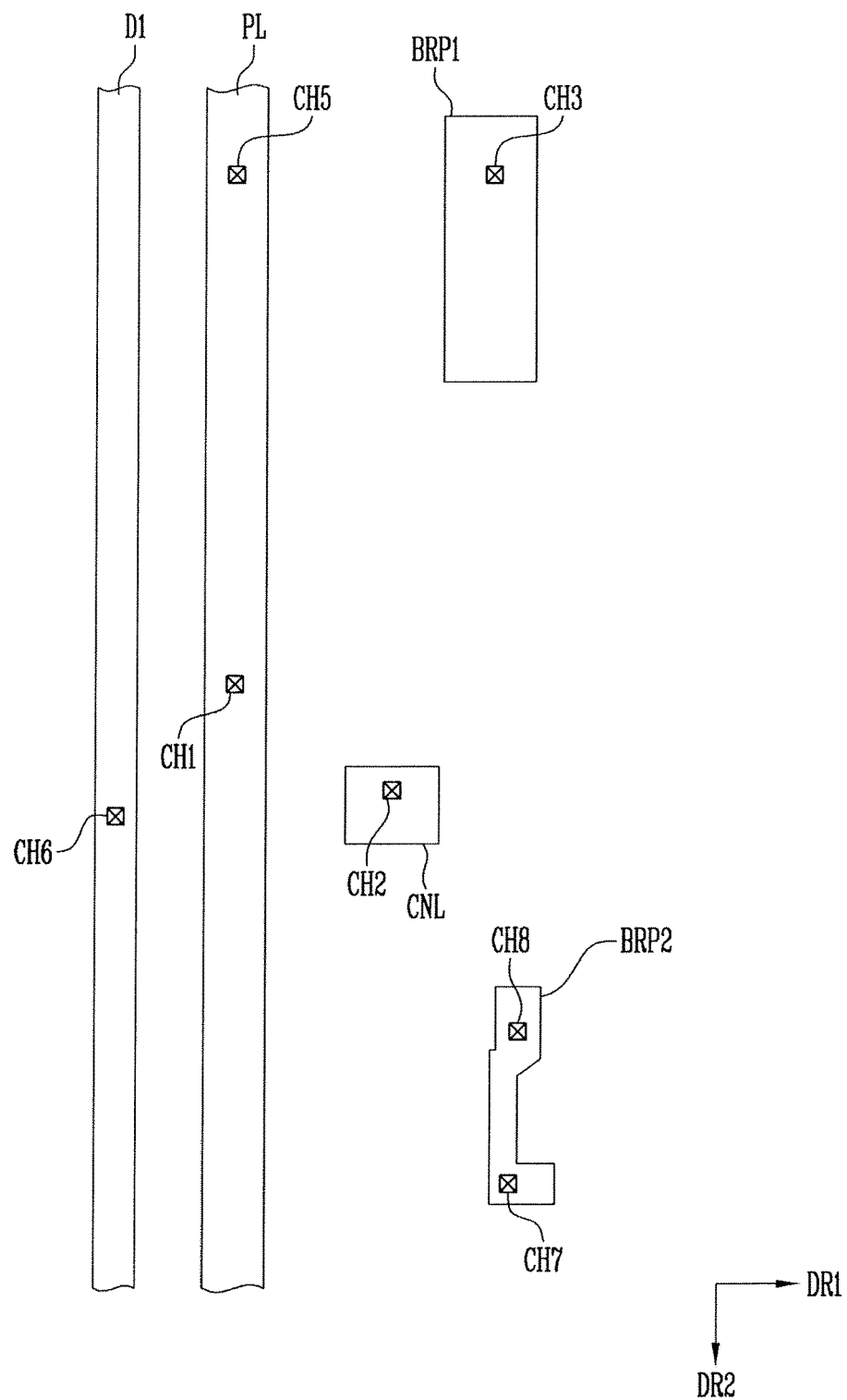
Figure 10B:
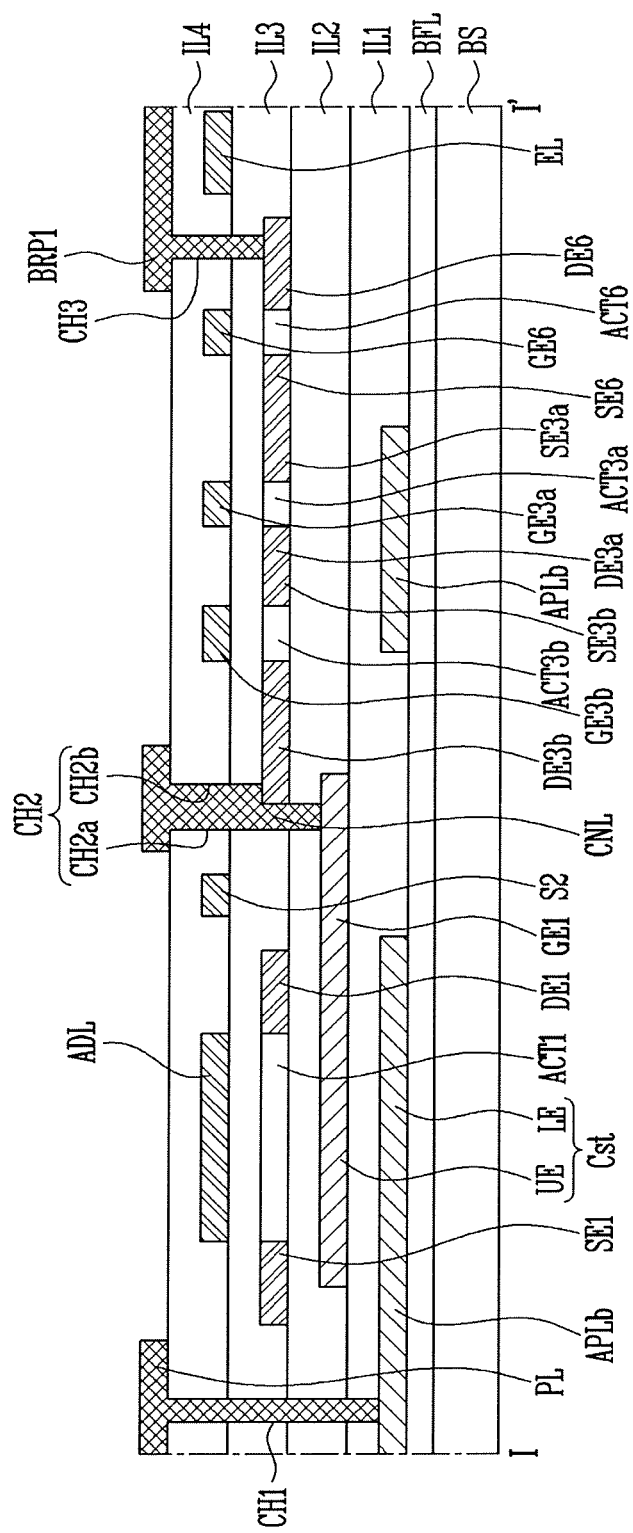

Referring to FIGS. 10A and 10B, a fourth insulating layer IL4 is formed on the base substrate BS, on which the light emitting control line EL, the first scan line S1, the second scan line S2, the anti-doping layer ADL, the third gate electrode GE3a and GE3b, and the sixth gate electrode GE6 are formed. The fourth insulating layer IL4 may include an inorganic insulating material including an inorganic material and/or an organic insulating material including an organic material.

Subsequently, first to third contact holes CH1 to CH3 and fifth to eighth contact holes CH5 to CH8, which pass through the insulating layers IL1, IL2, IL3, and IL4, are formed. Then, a data line D1, a power source line, a first bridge pattern BRP1, a second bridge pattern BRP2, and a connection line CNL are formed on the base substrate BS. The base substrate BS includes the first to third contact holes CH1 to CH3 and the fifth to eighth contact holes CH5 to CH8.

Figure 11A:
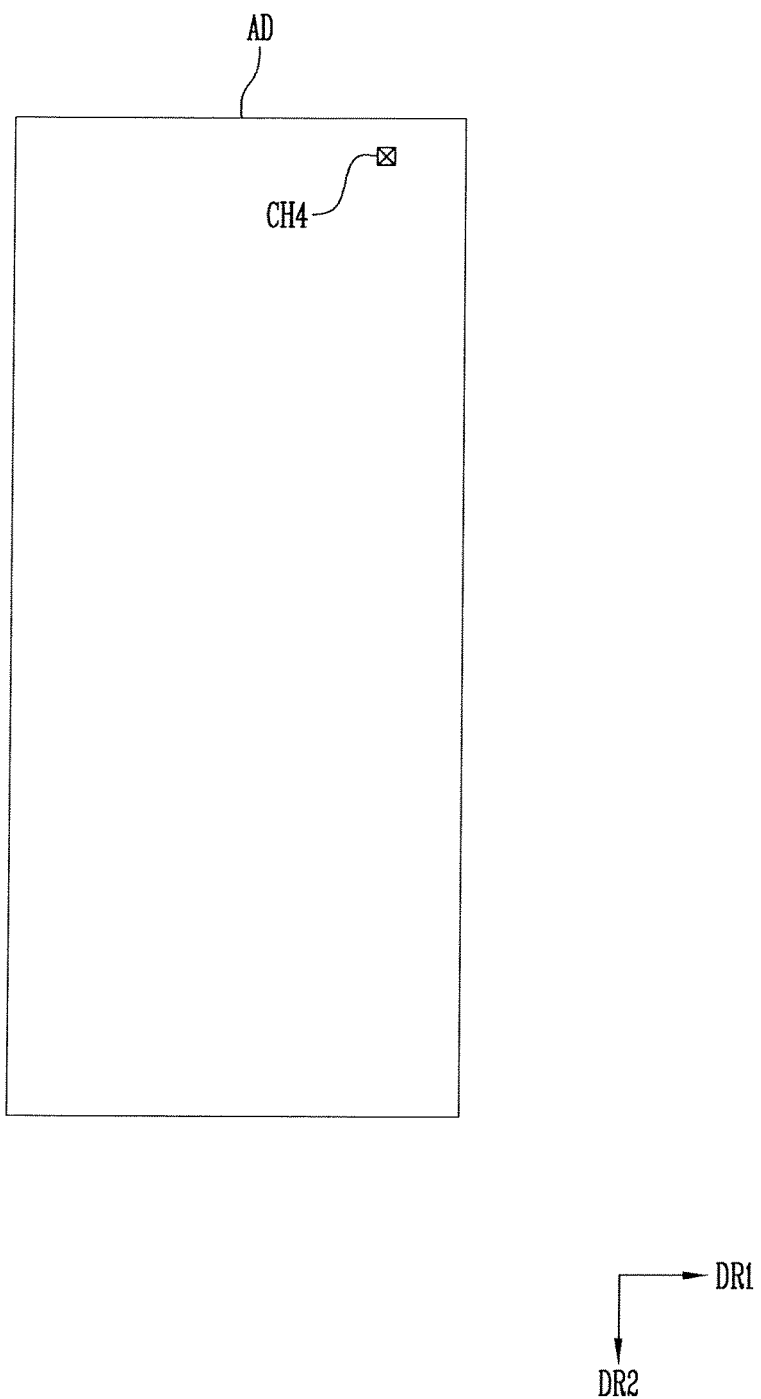
Figure 11B:
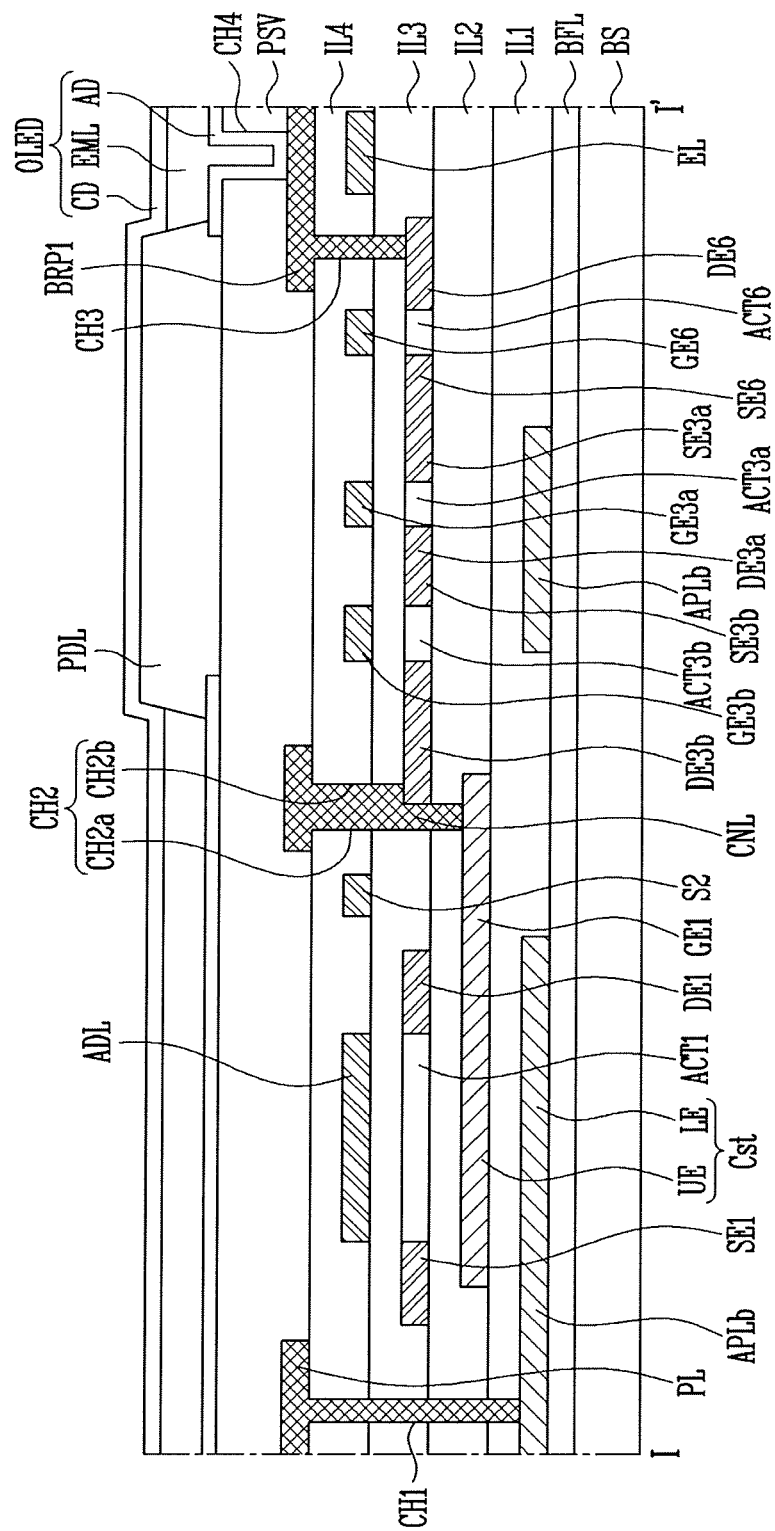

Referring to FIGS. 11A and 11B, a passivation layer PSV is formed on the base substrate BS, including the data line D1, the power source line PL, the first bridge pattern BRP1, the second bridge pattern BRP2, and the connection line CNL. The passivation layer PSV includes a fourth contact hole CH4. The fourth contact hole CH4 exposes a portion of the first bridge pattern BRP1, disposed under the passivation layer PSV, to another circuit.

Then, an anode electrode AD, electrically connected to the first bridge pattern BRP1 through the fourth contact hole CH4, is formed on the passivation layer PSV. Subsequently, a pixel defining layer PDL is formed on the anode electrode AD.

Figure 12:
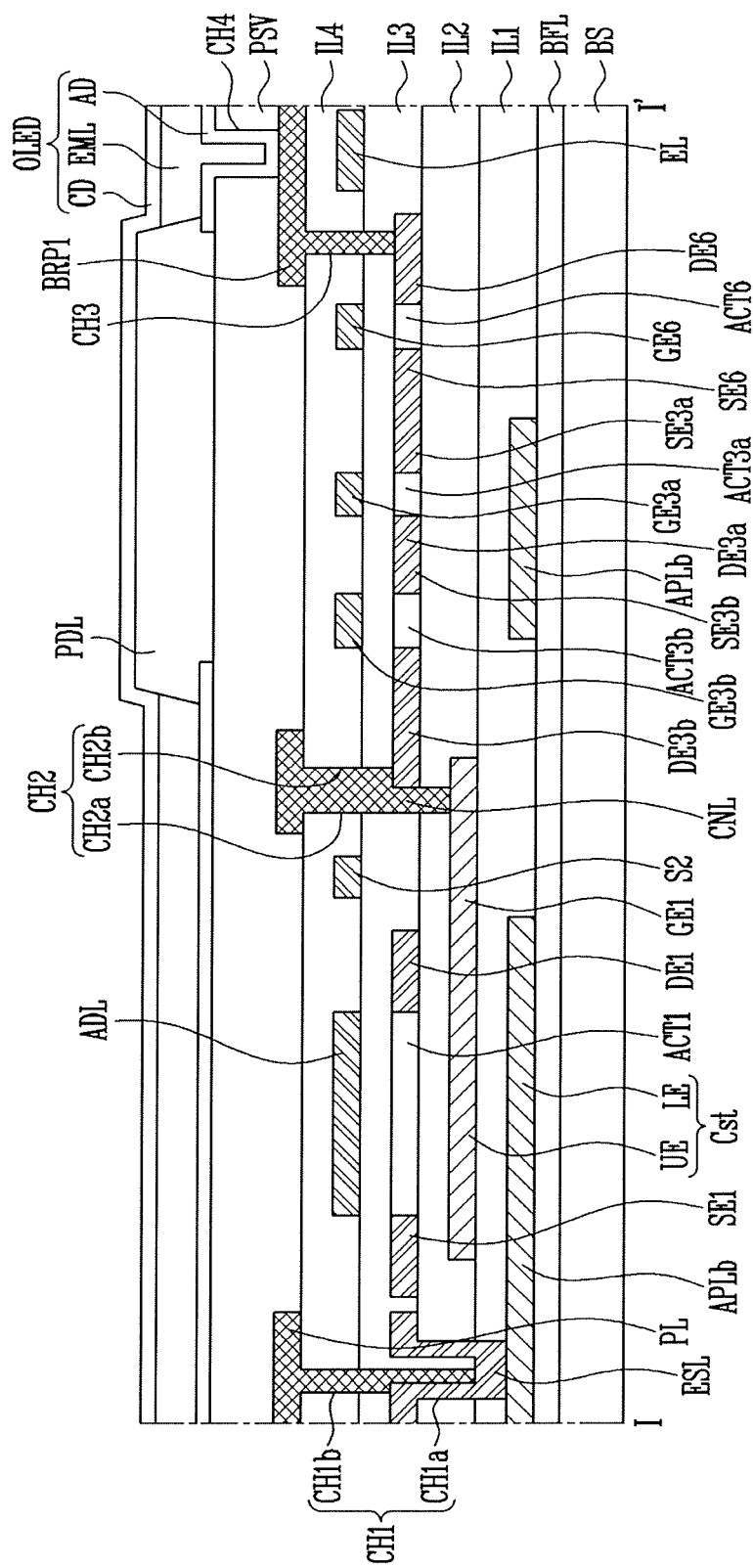
FIG. 12 is a sectional view illustrating the pixel of FIG. 4, according to an exemplary embodiment of the present invention.

FIG. 12 is a sectional view illustrating the pixel of FIG. 4, according to an exemplary embodiment of the present invention.

Referring to FIGS. 4 and 12, a display device, according to an exemplary embodiment of the present invention, includes a base substrate BS, a line part, and pixels PXL.

The line part provides a signal to each pixel, and includes scan lines S1 and S2, a data line D1, a light emitting control line EL, a power source line PL, an initialization power source line IPL, and an auxiliary power source line APL.

The power source line PL and the auxiliary power source line APL may be connected to each other through a first contact hole CH1, that passes through first to fourth insulating layers IL1 to IL4. The first contact hole CH1 may include a 1a-th contact hole CH1a that passes through the first and second insulating layers IL1 and IL2, and a 1b-th contact hole CH1b that passes through the third and fourth insulating layers IL3 and IL4.

An etch stop layer ESL may be provided between the 1a-th contact hole CH1a and the 1b-th contact hole CH1b. The etch stop layer ESL may be a semiconductor layer doped with impurities. The etch stop layer ESL may be disposed in the same layer as active patterns ACT1, ACT3a, ACT3b, and ACT6, disposed on the base substrate BS. The etch stop layer ESL may function to prevent the first and second insulating layers IL1 and IL2 from being over-etched in a process of forming the 1a-th contact hole CH1a and the 1b-th contact hole CH1b.

Figure 13:
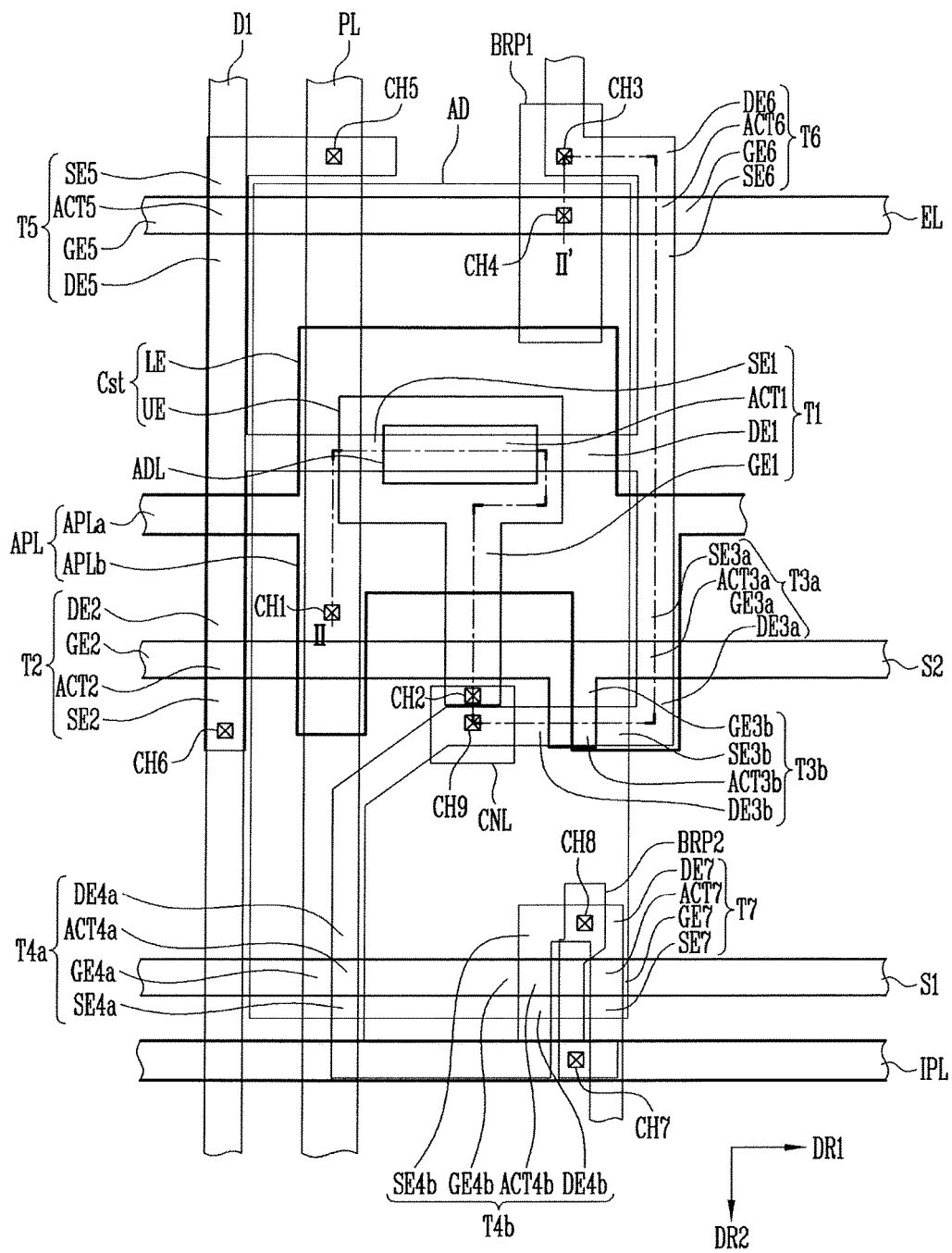
FIG. 13 is a plan view illustrating the pixel of FIG. 2, according to an exemplary embodiment of the present invention.
Figure 14:
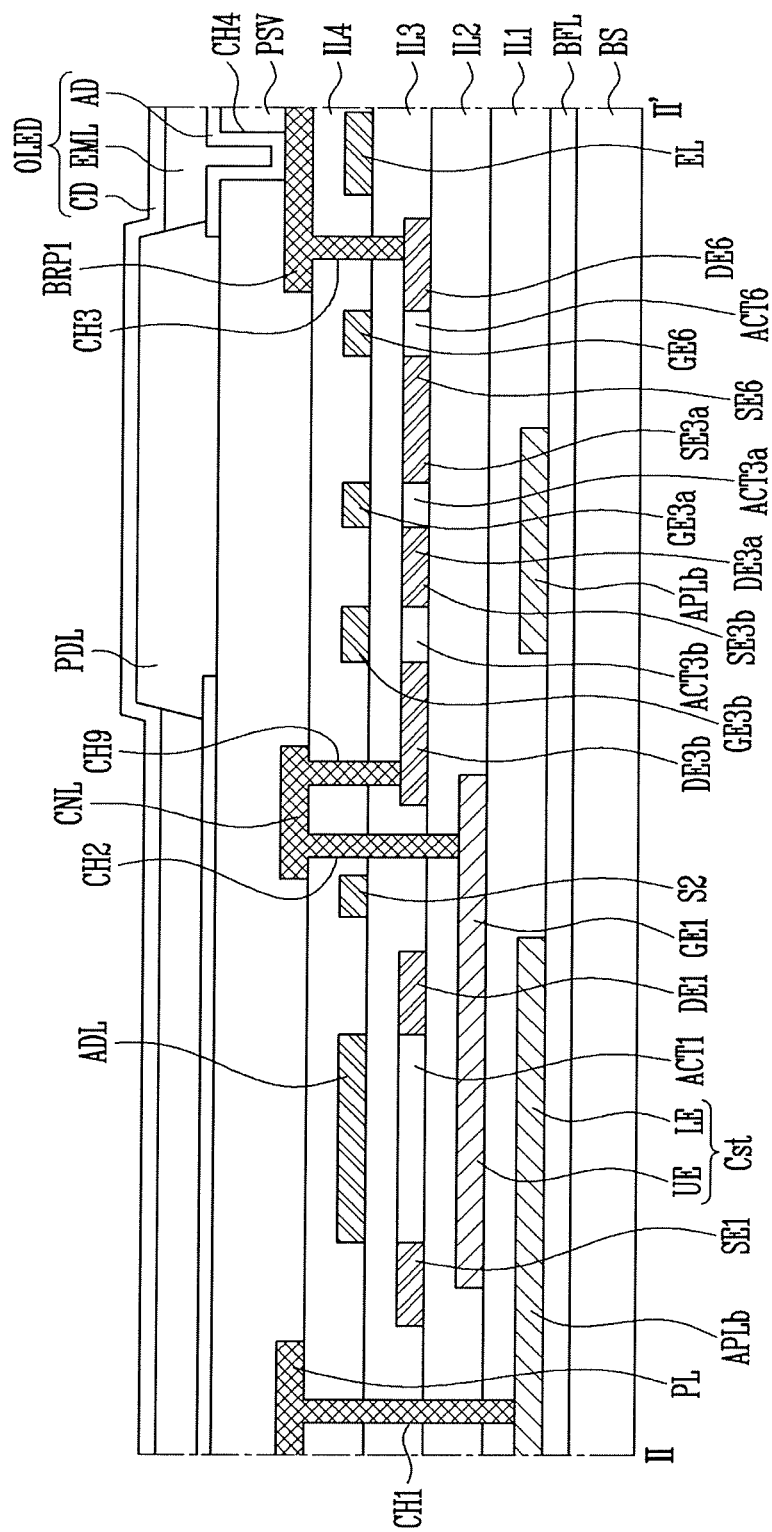
FIG. 14 is a sectional view taken along line II-II' of FIG. 13, according to an exemplary embodiment of the present invention.

FIG. 13 is a plan view illustrating the pixel of FIG. 2, according to an exemplary embodiment of the present invention. FIG. 14 is a sectional view taken along line II-II' of FIG. 13, according to an exemplary embodiment of the present invention.

Referring to FIGS. 2, 13, and 14, a display device, according to an exemplary embodiment of the present invention, includes a base substrate BS, a line part, and pixels PXL.

The line part provides a signal to each pixel, and includes scan lines S1 and S2, a data line D1, a light emitting control line EL, a power source line PL, an initialization power source line IPL, and an auxiliary power source line APL.

The auxiliary power source line APL may be electrically connected to the power source line PL through a first contact hole CH1. Therefore, a first power source supplied to the power source line PL may be provided to the auxiliary power source line APL.

Each pixel PXL includes first to seventh transistors T1 to T7, a storage capacitor Cst, a light emitting element OLED, and bridge patterns BRP1 and BRP2.

The first transistor T1 includes a first gate electrode GE1, a first active pattern ACT1, a first source electrode SE1, a first drain electrode DE1, and a connection line CNL. The connection line CNL may be connected to the first gate electrode GE1 through a second contact hole CH2. The second contact hole CH2 passes through a second insulating layer IL2, a third insulating layer IL3, and a fourth insulating layer IL4. Also, the connection line CNL may be a third drain electrode DE3 of the third transistor T3 and a fourth drain electrode DE4 of the fourth transistor T4 through a ninth contact hole CH9. The ninth hole CH9 passes through the third and fourth insulating layers IL3 and IL4.

The second transistor T2 includes a second gate electrode GE2, a second active pattern ACT2, a second source electrode SE2, and a second drain electrode DE2.

The third transistor T3 includes a 3a-th transistor T3a and a 3b-th transistor T3b. The 3a-th transistor T3a includes a 3a-th gate electrode GE3a, a 3a-th active pattern ACT3a, a 3a-th source electrode SE3a, and a 3a-th drain electrode DE3a. The 3b-th transistor T3b includes a 3b-th gate electrode GE3b, a 3b-th active pattern ACT3b, a 3b-th source electrode SE3b, and a 3b-th drain electrode DE3b.

The fourth transistor T4 includes a 4a-th transistor T4a and a 4b-th transistor T4b. The 4a-th transistor T4a includes a 4a-th gate electrode GE4a, a 4a-th active pattern ACT4a, a 4a-th source electrode SE4a, and a 4a-th drain electrode DE4a. The 4b-th transistor T4b includes a 4b-th gate electrode GE4b, a 4b-th active pattern ACT4b, a 4b-th source electrode SE4b, and a 4b-th drain electrode DE4b.

The fifth transistor T5 includes a fifth gate electrode GE5, a fifth active pattern ACT5, a fifth source electrode SE5, and a fifth drain electrode DE5.

The sixth transistor T6 includes a sixth gate electrode GE6, a sixth active pattern ACT6, a sixth source electrode SE6, and a sixth drain electrode DE6.

The seventh transistor T7 includes a seventh gate electrode GE7, a seventh active pattern ACT7, a seventh source electrode SE7, and a seventh drain electrode DE7.

The storage capacitor Cst includes a lower electrode LE and an upper electrode UE. The lower electrode LE may be part of the same structure which includes the auxiliary power source line APL. The upper electrode UE overlaps with the lower electrode LE. The upper electrode UE and the lower electrode LE may constitute the storage capacitor Cst with a first insulating layer IL1 interposed therebetween.

The upper electrode UE may partially extend along a second direction DR2. A portion of the upper electrode UE, which extends along the second direction DR2, may be the first gate electrode GE1. In plan view, the first gate electrode GE1 includes a region which does not overlap the lower electrode LE. The second contact hole CH2 may be formed in the region of the first gate electrode GE1 which does not overlap the lower electrode LE. The region in which the second contact hole CH2 is formed may correspond to a region in which the upper electrode UE and the lower electrode LE do not overlap with each other.

Thus, in comparison to a display device in which a contact hole (or opening) is disposed in a region in which upper and lower electrodes of a storage capacitor overlap with each other, in a display device according to an exemplary embodiment of the present invention, the second contact hole CH2 is disposed in a region in which the upper electrode UE and the lower electrode LE do not overlap with each other. Accordingly, the structural complexity and/or spatial limitations of the storage capacitor Cst may be reduced. As the spatial and/or structural limitations of the region in which the storage capacitor Cst is disposed are reduced, a display device having a high resolution may be manufactured quickly and efficiently.

Figure 15:
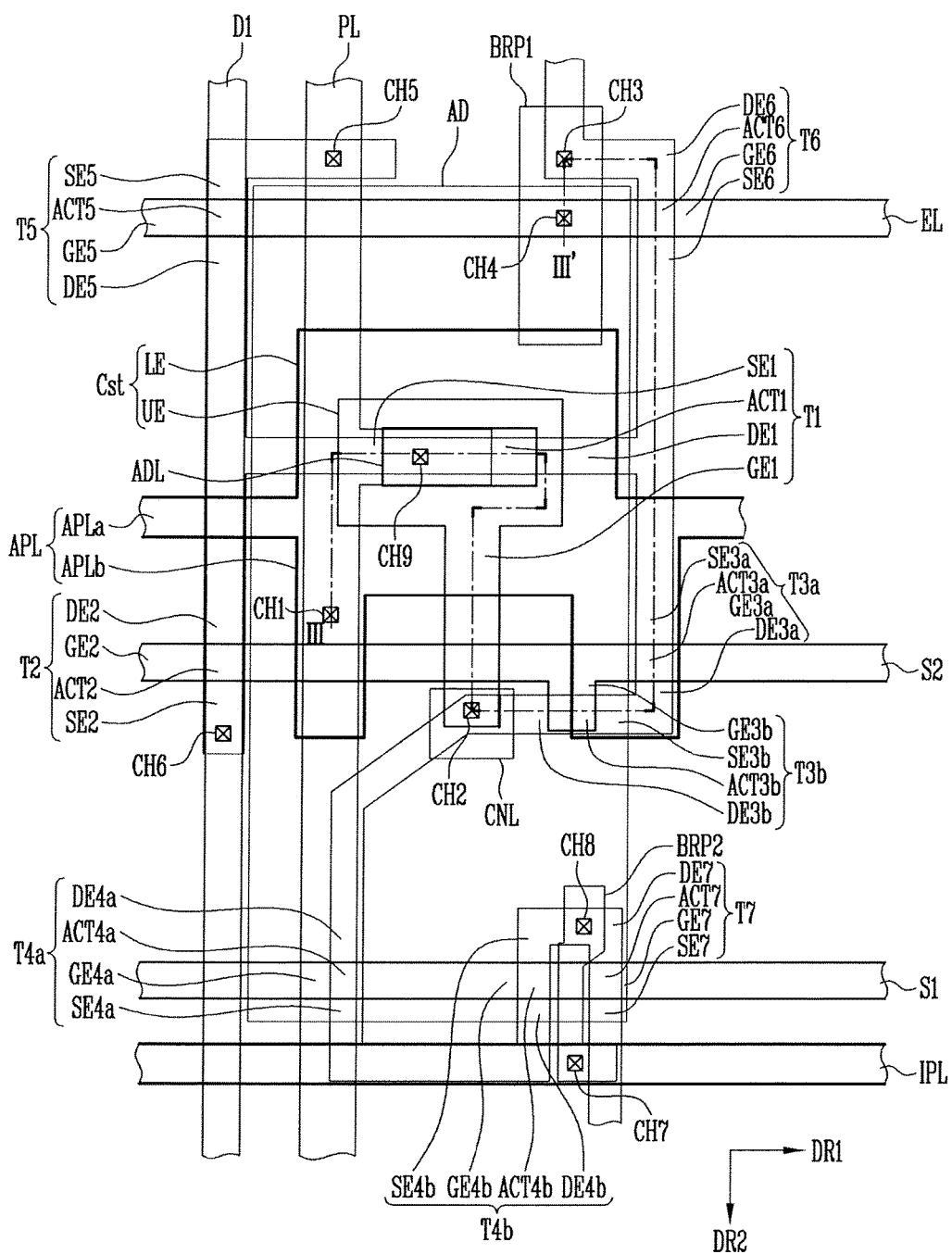
FIG. 15 is a plan view illustrating the pixel of FIG. 2, according to an exemplary embodiment of the present invention.
Figure 16:
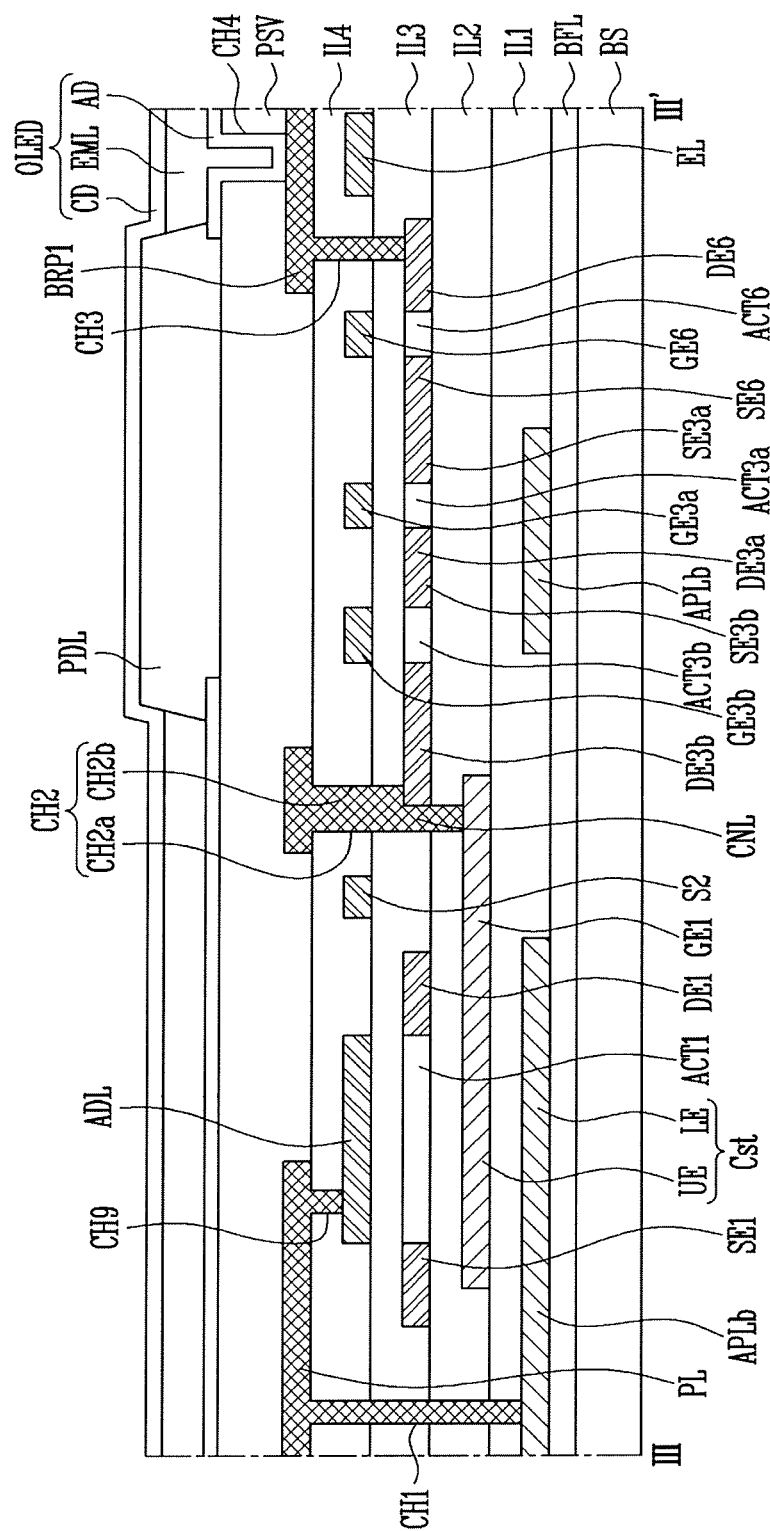
FIG. 16 is a sectional view taken along line III-III' of FIG. 15, according to an exemplary embodiment of the present invention.

FIG. 15 is a plan view illustrating the pixel of FIG. 2, according to an exemplary embodiment of the present invention. FIG. 16 is a sectional view taken along line of FIG. 15, according to an exemplary embodiment of the present invention.

Referring to FIGS. 2, 15, and 16, a display device, according to an exemplary embodiment of the present invention, includes a base substrate BS, a line part, and pixels PXL.

The line part provides a signal to each pixel, and includes scan lines S1 and S2, a data line D1, a light emitting control line EL, a power source line PL, an initialization power source line IPL, and an auxiliary power source line APL.

The power source line PL extends along a second direction DR2, and may be disposed on the base substrate BS to be spaced apart from the data line D1. A first power source is applied to the power source line PL. The power source line PL may partially extend along a first direction DR1 intersecting to the second direction DR2. A portion of the power source line PL, which extends along the first direction DR1, may be electrically connected to an anti-doping layer ADL through a ninth contact hole CH9. Therefore, the first power source may be applied to the anti-doping layer ADL.

The auxiliary power source line APL may be electrically connected to the power source line PL through a first contact hole CH1. Therefore, the first power source provided to the power source line PL may be provided to the auxiliary power source line APL.

Each pixel PXL includes first to seventh transistors T1 to T7, a storage capacitor Cst, a light emitting element OLED, and bridge patterns BRP1 and BRP2.

The first transistor T1 includes a first gate electrode GE1, a first active pattern ACT1, a first source electrode SE1, a first drain electrode DE1, and a connection line CNL.

The second transistor T2 includes a second gate electrode GE2, a second active pattern ACT2, a second source electrode SE2, and a second drain electrode DE2.

The third transistor T3 includes a 3a-th transistor T3a and a 3b-th transistor T3b. The 3a-th transistor T3a includes a 3a-th gate electrode GE3a, a 3a-th active pattern ACT3a, a 3a-th source electrode SE3a, and a 3a-th drain electrode DE3a. The 3b-th transistor T3b includes a 3b-th gate electrode GE3b, a 3b-th active pattern ACT3b, a 3b-th source electrode SE3b, and a 3b-th drain electrode DE3b.

The fourth transistor T4 includes a 4a-th transistor T4a and a 4b-th transistor T4b. The 4a-th transistor T4a includes a 4a-th gate electrode GE4a, a 4a-th active pattern ACT4a, a 4a-th source electrode SE4a, and a 4a-th drain electrode DE4a. The 4b-th transistor T4b includes a 4b-th gate electrode GE4b, a 4b-th active pattern ACT4b, a 4b-th source electrode SE4b, and a 4b-th drain electrode DE4b.

The fifth transistor T5 includes a fifth gate electrode GE5, a fifth active pattern ACT5, a fifth source electrode SE5, and a fifth drain electrode DE5.

The sixth transistor T6 includes a sixth gate electrode GE6, a sixth active pattern ACT6, a sixth source electrode SE6, and a sixth drain electrode DE6.

The seventh transistor T7 includes a seventh gate electrode GE7, a seventh active pattern ACT7, a seventh source electrode SE7, and a seventh drain electrode DE7.

The storage capacitor Cst includes a lower electrode LE and an upper electrode UE.

The lower electrode LE is disposed in the same layer as the auxiliary power source line APL, and may be connected to the auxiliary power source line APL. Also, the lower electrode LE may be integrally formed with the auxiliary power source line APL. The lower electrode LE may be disposed between the base substrate BS and the upper electrode UE.

In plan view, the upper electrode UE overlaps with the lower electrode LE, and the upper electrode UE and the lower electrode LE may constitute the storage capacitor Cst with a first insulating layer IL1 interposed therebetween. The overlapping area of the upper electrode UE and the lower electrode LE may be increased so that the capacitance of the storage capacitor Cst may be increased.

The upper electrode UE may partially extend along the second direction DR2. A portion of the upper electrode UE, which extends along the second direction DR2, may be the first gate electrode GE1. For example, the upper electrode UE may be integrally formed with the first gate electrode GE1. In plan view, the first gate electrode GE1 includes a region which does not overlap the lower electrode LE. The second contact hole CH2 may be formed in the region of the first gate electrode GE1 which does not overlap the lower electrode LE. The region in which the second contact hole CH2 is formed may correspond to a region in which the upper electrode UE and the lower electrode LE do not overlap with each other.

Thus, in comparison to a display device in which a contact hole (or opening) is disposed in a region in which upper and lower electrodes of a storage capacitor overlap with each other, in a display device according to an exemplary embodiment of the present invention, the second contact hole CH2 is disposed in a region in which the upper electrode UE and the lower electrode LE do not overlap with each other. Accordingly, the structural complexity and/or spatial limitations of the storage capacitor Cst may be reduced. As the spatial and/or structural limitations of the region in which the storage capacitor Cst is disposed are reduced, a display device having a high resolution may be manufactured quickly and efficiently.

A display device, according to one or more exemplary embodiments of the present invention, can be employed in various electronic devices. For example, the display device may be included in televisions, notebook computers, cellular phones, smart phones, smart pads, portable media players (PMPs), personal digital assistants (PDAs), navigations, various wearable devices such as smart watches, and the like.

According to one or more to exemplary embodiments of the present invention, a display device may display high resolution image.

According to one or more to exemplary embodiments of the present invention, a method is provided to manufacture display device having a high resolution.

While the present invention has been particularly shown and described with reference to exemplary embodiments thereof, it will be apparent to those of ordinary skill in the art that various changes in form and detail may be made therein without departing from the spirit and scope of the present invention.

What is claimed is:

1. A display device, comprising:
a scan line extending primarily in a first direction and disposed on a substrate, the scan line transmitting a scan signal;
a data line extending primarily in a second direction intersecting the first direction, the data line transmitting a data signal;
a driving voltage line extending primarily in the second direction, the driving voltage line transmitting a driving voltage;
a plurality of transistors including a first transistor and a second transistor, wherein the second transistor is connected to the scan line and the data line, and the first transistor is connected to the second transistor;
a light emitting element connected to the plurality of transistors; and
a storage capacitor disposed between the substrate and an active pattern of the first transistor, the storage capacitor including a first electrode disposed on the substrate and a second electrode at least partially overlapping the first electrode,
wherein a first insulating layer is disposed between the first and second electrodes.

2. The display device of claim 1, further comprising an auxiliary power source line disposed on the substrate,
wherein the auxiliary power source line is electrically connected to the driving voltage line.

3. The display device of claim 2, wherein an interlayer insulating layer is disposed on the first insulating layer,
wherein the driving voltage line is disposed on the first insulating layer and the interlayer insulating layer, and
wherein the driving voltage line is connected to the auxiliary power source line through a first contact hole, the first contact hole passing through the first insulating layer and the interlayer insulating layer.

4. The display device of claim 3, wherein the auxiliary power source line is disposed in the same layer as the first electrode.

5. The display device of claim 4, wherein the auxiliary power source line includes a first region protruding from the first electrode in the first direction and a second region protruding from the first electrode in the second direction.

6. The display device of claim 5, wherein the first and second regions of the auxiliary power source line are provided in a mesh form on the substrate.

7. The display device of claim 1, wherein the first electrode or the second electrode blocks light transmitted through a first surface of the substrate.

8. The display device of claim 3, wherein the first transistor includes:
a gate electrode disposed on the first insulating layer;
the active pattern disposed on the gate electrode with the interlayer insulating layer disposed between the active pattern and the gate electrode; and
source and drain electrodes each connected to the active pattern.

9. The display device of claim 8, wherein the gate electrode is the second electrode of the storage capacitor, and the gate electrode overlaps the first electrode of the storage capacitor with the first insulating layer disposed between the gate electrode and the first electrode of the storage capacitor.

10. The display device of claim 8, further comprising an anti-doping layer disposed on the active pattern, wherein the anti-doping layer provides a channel region of the active pattern.

11. The display device of claim 10, wherein the anti-doping layer is disposed in a same layer as the scan line.

12. The display device of claim 11, wherein the anti-doping layer is electrically connected to the driving voltage line.

13. The display device of claim 3, wherein the interlayer insulating layer includes:
a second insulating layer disposed on the second electrode;
a third insulating layer disposed on the second insulating layer; and
a fourth insulating layer disposed on the third insulating layer.

14. The display device of claim 13, wherein the first transistor and the second transistor are electrically connected to each other through a second contact hole and a connection line is disposed in the second contact hole,
wherein a first side of the second contact hole passes through the third and fourth insulating layers, and a second side of the second contact hole, opposite to the first side of the second contact hole, passes through the second, third and fourth insulating layers.

15. The display device of claim 13, wherein a first end of each of the first and second transistors is connected to a third contact hole, the third contact hole passing through the second, third and fourth insulating layers, and
wherein a second end of each of the first and second transistors, opposite to the first end of each of the respective first and second transistors, is connected to a fourth contact hole, the fourth contact hole passing through the third and fourth insulating layers, wherein a connection line is disposed in the fourth contact hole.

16. The display device of claim 15, further comprising an etch stop layer disposed inside the first contact hole to prevent the first contact hole from being over-etched.

17. The display device of claim 16, wherein the etch stop layer electrically connects the auxiliary power source line to the driving voltage line.

* * * * *